United States Patent [19]

Shirai et al.

[11] Patent Number: 4,525,442
[45] Date of Patent: Jun. 25, 1985

[54] PHOTOCONDUCTIVE MEMBER CONTAINING AN AMORPHOUS BORON LAYER

[75] Inventors: Shigeru Shirai, Yamato; Junichiro Kanbe; Tadaji Fukuda, both of Yokohama, all of Japan

[73] Assignee: Canon Kabushiki Kaisha, Tokyo, Japan

[21] Appl. No.: 631,006

[22] Filed: Jul. 16, 1984

Related U.S. Application Data

[63] Continuation of Ser. No. 334,572, Dec. 28, 1981, abandoned.

[30] Foreign Application Priority Data

| Jan. 9, 1981 | [JP] | Japan | 56-2275 |
| Jan. 10, 1981 | [JP] | Japan | 56-2244 |
| Jan. 10, 1981 | [JP] | Japan | 56-2245 |
| Jan. 13, 1981 | [JP] | Japan | 56-3592 |
| Jan. 13, 1981 | [JP] | Japan | 56-3593 |
| Jan. 13, 1981 | [JP] | Japan | 56-3594 |

[51] Int. Cl.$^3$ .............................. G03G 5/082
[52] U.S. Cl. ........................ 430/57; 430/65; 430/66; 430/84; 427/74; 252/501.1; 357/2
[58] Field of Search ............ 430/57, 60, 65, 66, 430/67, 84; 427/74; 252/501.1; 357/2

[56] References Cited

U.S. PATENT DOCUMENTS

| 3,650,737 | 3/1972 | Maissel et al. | 430/67 X |
| 4,200,473 | 4/1980 | Carlson | 427/74 X |
| 4,217,374 | 8/1980 | Ovshinsky et al. | 430/84 X |
| 4,226,898 | 10/1980 | Ovshinsky et al. | 430/84 X |
| 4,265,991 | 5/1981 | Hirai et al. | 430/65 X |
| 4,330,182 | 5/1982 | Coleman | 430/84 X |
| 4,359,512 | 11/1982 | Fukuda et al. | 430/65 X |

OTHER PUBLICATIONS

Shimizu et al., "Photoreceptor of α-Si:H with Diode-like Structure for Electrophotography", J. Appl. Phys. 52 (4), Apr. 1981, pp. 2776-2781.

*Primary Examiner*—Roland E. Martin
*Attorney, Agent, or Firm*—Fitzpatrick, Cella, Harper & Scinto

[57] ABSTRACT

A photoconductive member comprises a photoconductive layer constituted of an amorphous material containing at least one of hydrogen atoms and halogen atoms in a matrix of silicon atoms and an amorphous layer constituted of an amorphous material containing at least one of hydrogen atoms and halogen atoms in a matrix of boron atoms.

14 Claims, 5 Drawing Figures

PHOTOCONDUCTIVE MEMBER CONTAINING AN AMORPHOUS BORON LAYER

This application is a continuation of application Ser. No. 334,572 filed Dec. 28, 1981, now abandoned.

BACKGROUND OF THE INVENTION

1. Field of the Invention

This invention relates to a photoconductive member having a sensitivity to electromagnetic waves such as light (herein used in a broad sense, including ultravoilet rays, visible light, infrared rays, X-rays and gamma-rays).

2. Description of the Prior Arts

Photoconductive materials, which constitute image-forming members for electrophotography in solid state image pick-up devices or in the field of image formation or photoconductive layers in manuscript reading devices, are required to have a high sensitivity, a high SN ratio [Photocurrent($I_p$)/Dark current($I_d$)], spectral characteristics matching to those of an electromagnetic wave to be irradiated, a rapid response to light, a desired dark resistance value as well as no harm to human bodies during usage. Further, in a solid state image pick-up device, it is also required that the residual image should easily be treated within a predetermined time. In particular, in case of an image-forming member for electrophotography to be assembled in an electrophotographic device to be used in an office as office apparatus, the aforesaid harmless characteristic is very important.

From the standpoint as mentioned above, amorphous silicon (hereinafter referred to as a—Si) has recently attracted attention as a photoconductive material. For example, German Laid-open Patent Application Nos. 2746967 and 2855718 disclose applications of a—Si for use in image-forming members for electrophotography, and German Laid-open Patent Application No. 2933411 an application of a—Si for use in a photoconverting reading device.

However, the photoconductive members having photoconductive layers constituted of a—Si of prior art have various electrical, optical and photoconductive characteristics such as dark resistance value, photosensitivity and response to light as well as environmental characteristics in use such as humidity resistance, which should further be improved. Thus, in a practical solid state image pick-up device, reading device or an image-forming member for electrophotography including wide scope of applications they cannot effectively be used also in view of their productivity and possibility of their mass production.

For instance, when applied in an image-forming member for electrophotography, residual potential is frequently observed to remain during use thereof. When such a photoconductive member is repeatedly used for a long time, there will be caused various inconveniences such as accumulation of fatigues by repeated uses or so called ghost phenomenon wherein residual images are formed.

Further, according to a great number of experiments conducted by the present inventors, a—Si material constituting the photoconductive layer of an image-forming member for electrophotography, while it has a number of advantages, as compared with Se, CdS, ZnO or OPC (organic photoconductive materials) such as PVCz or TNF of prior art, it also found to have several problems to be solved. Namely, when charging treatment is applied for formation of electrostatic images on the photoconductive layer of an image-forming member for electrophotography having a photoconductive member constituted of a mono-layer of a—Si which has been endowed with characteristics for use in a solar battery of prior art, dark decay is markedly rapid, whereby it is difficult to apply a conventional photographic method. This tendency is further pronounced under a humid atmosphere to such an extent in some cases that no charge is retained at all before development.

Thus, it is required in designing of a photoconductive material to make efforts to obtain desirable electrical, optical and photoconductive characteristics along with the improvement of a—Si materials per se.

In view of the above points, the present invention contemplates the achievement obtained as a result of extensive studies made comprehensively from the standpoints of applicability and utility of a—Si as a photoconductive member for image-forming members for electrophotography, solid state image pick-up devices or reading devices. It has now been found that a photoconductive member elaborated to have a specific layer structure comprising a photoconductive layer constituted of a so called hydrogenated amorphous silicon, a halogenated amorphous silicon or a halogen-containing hydrogenated amorphous silicon [hereinafter referred comprehensively as a—Si(H, X)], which is an amorphous material containing at least one of hydrogen atom(H) or halogen atom(X) in a matrix of silicon, is not only useful in practice but also has characteristics superior in substantially all respects to those of the photoconductive members of prior art, especially markedly excellent characteristics as a photoconductive member for electrophotography. The present invention is based on this finding.

SUMMARY OF THE INVENTION

The primary object of the present invention is to provide a photoconductive member having constantly stable electrical, optical and photoconductive characteristics, which is an all-environment type substantially without limitations with respect to the environment under which it is used, being excellent in light-resistant fatigue without deterioration after repeated uses and free entirely or substantially from residual potentials observed.

Another object of the present invention is to provide a photoconductive member, which is sufficiently capable of retaining charges at the time of charging treatment for formation of electrostatic images to the extent such that a conventional electrophotographic method can be applied when it is provided for use as an image-forming member for electrophotography.

Still another object of the present invention is to provide a photoconductive member for electrophotography capable of providing easily a high quality image which is high in density, clear in halftone and high in resolution.

According to an aspect of the present invention, there is provided a photoconductive member comprising a support, a photoconductive layer constituted of an amorphous material containing at least one of hydrogen atoms and halogen atoms in a matrix of silicon atoms, and an amorphous layer constituted of an amorphous material containing at least one of hydrogen atoms and halogen atoms in a matrix of boron atoms.

According to another aspect of the present invention, there is provided a photoconductive member comprising a support, a photoconductive layer constituted of an amorphous material containing at least one of hydrogen atoms and halogen atoms in a matrix of silicon, a barrier layer disposed between said support and said photoconductive layer and having the function to prevent substantially injection of charges from the side of said support to the side of said photoconductive layer, and an amorphous layer provided on the upper surface of said photoconductive layer and constituted of an amorphous material containing at least one of hydrogen atoms and halogen atoms in a matrix of boron atoms.

According to further aspect of the present invention, there is provided a photoconductive member comprising a support, a photoconductive layer constituted of an amorphous material containing at least one of hydrogen atoms and halogen atoms in a matrix of silicon atoms, an amorphous layer disposed between said support and said photoconductive member and constituted of an amorphous material containing at least one of hydrogen atoms and halogen atoms in a matrix of boron atoms, and a barrier layer provided on the upper surface of said photoconductive layer.

DESCRIPTION OF THE PREFERRED EMBODIMENTS

Figure 1:
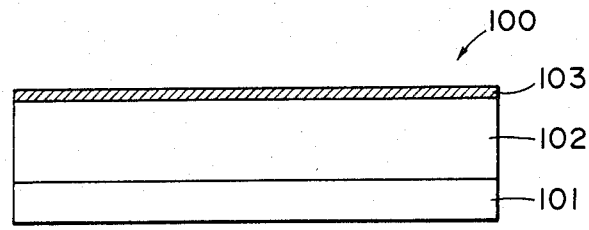
FIGS. 1 to 4 show schematic sectional views for illustration of the layer structures of preferred embodiments of the photoconductive members according to the present invention, respectively.

The first basic structure of the photoconductive member according to the present invention comprises a support, a photoconductive layer and a surface barrier layer provided on these, namely on the surface side, having the function to prevent injection of charges from the surface into said photoconductive layer. Further, said photoconductives layer is constituted of an amorphous material containing hydrogen atoms (H) or halogen atoms (X) or both thereof in a matrix of silicon atoms, and said surface barrier layer constituted of an amorphous material containing hydrogen atoms (H) or halogen atoms (X) or both thereof in a matrix of boron atoms. At the interface between these layers, there is formed a barrier layer or a depletion layer, said barrier layer being capable of barring injection of electrons into said photoconductive layer, while permitting passage of photo-carriers generated in the photoconductive layer by irradiation of an electromagnetic wave.

The aforesaid surface barrier layer in the photoconductive member of this invention is found to be capable of barring injection of electrons into said photoconductive layer but incapable of barring injection of positive holes into said photoconductive layer. Accordingly, the photoconductive member of the above structure in the present invention has a specific polarity and only negative charging can suitably be employed in charging treatment of said member surface.

The second basic structure of the photoconductive member of this invention comprises a support, a photoconductive layer and an intermediate layer which is disposed between the support and the photoconductive layer and has a function to bar injection of carriers from the side of the support into said photoconductive layer.

And, said photoconductive layer is constituted of an amorphous material containing hydrogen atoms (H) or halogen atoms (X) or both thereof in a matrix of silicon atoms, and said intermediate layer constituted of an amorphous material containing hydrogen atoms (H) or halogen atoms (X) or both thereof in a matrix of boron atoms. At the interface between the intermediate layer and the photoconductive layer, there is formed a barrier layer or a depletion layer, said intermediate layer being capable of barring injection of electrons from the side of the support into said photoconductive layer, while permitting passage of photo-carriers generated in the photoconductive layer by irradiation of an electromagnetic wave.

The aforesaid intermediate layer in the photoconductive member of this invention is found to be capable of barring injection of electrons into said photoconductive layer but incapable of barring injection of positive holes into said photoconductive layer. Accordingly, the photoconductive member of the above structure in the present invention has a specific polarity and only positive charging can suitably be employed in charging treatment of said member surface.

Each of the photoconductive members according to the present invention which is designed to have the abovementioned layer structure can overcome all of the various problems as described above and exhibits very excellent electrical, optical, photoconductive characteristics and environmental adaptability during usage.

In particular, when applied as an image-forming member for electrophotography, it is excellent in charge retaining ability without influence of residual potential on image formation having electrical characteristics which are stable, as well as a high SN ratio with high sensitivity. Thus, it is markedly excellent in light fatigue resistance and adaptability for repeated uses, and can provide a visible image of high quality, being high in density, clear in halftone and high in resolution.

Furthermore, a photoconductive member having a layer constitution of prior art cannot be applied for an image-forming member for electrophotography in either the case of an a—Si (H, X) with high dark resistivity or the case of an a—Si (H, X) with high photosensitivity, since the former tends to be lowered in photosensitivity, while the latter has a low dark resistivity with at most $10^8$ ohm.cm. In contrast, in the photoconductive member according to the present invention, even an a—Si(H, X) with a relatively low resistivity ($5 \times 10^9$ ohm.cm or more) can constitute a photoconductive layer for electrophotography based on the particular layer structure, and hence an a—Si(H, X) having a high sensitivity but a relatively lower resistivity can be sufficiently available. Thus, the restrictions with respect to the characteristics of a—Si(H, X) can be alleviated.

In the photoconductive member having the first basic structure as described above, for prevention of dark decay of potential at the time of charging, it is also possible to further provide a lower barrier layer between the support and the photoconductive layer, thus forming a structure having a support, a lower barrier layer, a photoconductive layer and a surface barrier layer determined in the order mentioned. In this case, the lower barrier layer has the function to bar effectively injection of free carriers from the side of the support into the photoconductive layer and permit photo-carriers generated in the photoconductive layer on irradiation of an electromagnetic wave to flow out to the side of the support, and may preferably be constituted of a metal oxide such as $Al_2O_3$ and the like or an amorphous material containing carbon atoms, oxygen atoms or nitrogen atoms in a matrix of silicon atoms.

In the photoconductive member having the second basic structure as described above, for prevention of dark decay or potential at the time of charging, it is also possible to further provide a surface barrier layer on the photoconductive layer, thus forming a structure having a support, an intermediate layer, a photoconductive layer and a surface barrier layer laminated in the order mentioned. In this case, the surface layer has the function to bar effectively injection of charges from the side of the surface into the photoconductive layer and permit photocarriers generated in the photoconductive layer on irradiation of an electromagnetic wave to recombine with charges, and may preferably be constituted of a metal oxide such as $Al_2O_3$ and the like or an amorphous material containing carbon atoms, oxygen atoms or nitrogen atoms in a matrix of silicon atoms as hereinafter described.

Referring now to the drawing, the photoconductive members according to the present invention are to be described in detail below.

FIG. 1 shows a schematic sectional view for illustration of the layer structure of the first embodiment of the photoconductive member of this invention.

The photoconductive member 100 as shown in FIG. 1 has a layer structure comprising a support 101 for photoconductive member, a photoconductive member 102 provided on said support, and a surface barrier layer 103 provided in direct contact with said photoconductive layer 102.

The support 101 may be either electroconductive or insulating. As the electroconductive material, there may be mentioned metals such as NiCr, stainless steel, Al, Cr, Mo, Au, Nb, Ta, V, Ti, Pt, Pd, etc., or alloys thereof.

As insulating supports, there may conventionally be used films or sheets of synthetic resins, including polyesters, polyethylene, polycarbonates, cellulose acetate, polypropylene, polyvinyl chloride, polyvinylidene chloride, polystyrene, polyamides, etc., glasses, ceramics, papers and the like. These insulating supports may preferably have at least one surface subjected to electroconductive treatment, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO($In_2O_3+SnO_2$) thereon. Alternatively, a film of synthetic resins such as polyesters can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by laminating treatment with said metal, thereby imparting electroconductivity to the surface. The support may be shaped in any form such as cylinders, belts, plates or others, and its form may be determined as desired. For example, when the photoconductive member 100 in FIG. 1 is to be used as an image-forming member for electrophotography, it may desirably be formed into an endless belt or a cylinder for use in continuous high speed copying. The support may have a thickness, which is conveniently determined so that a photoconductive member as desired may be formed. When the photoconductive member is required to have a flexibility, the support is made as thin as possible, so far as the function of a support can be exhibited. However, in such a case, the thickness is generally 10 u or more from the points of fabrication and handling of the support as well as its mechanical strength.

The surface barrier layer 103 has the function of barring effectively injection of surface charges into the photoconductive layer 102 when charging treatment is applied on its surface. That is, at the interface between the photoconductive layer 102 and the surface barrier layer, there is formed a depletion layer, said barrier layer capable of barring injection of electrons into said photoconductive member and enabling passage of carriers generated by irradiation of an electromagnetic wave.

The surface barrier layer in the present invention was found to be capable of barring injection of electrons into said photoconductive layer but almost incapable of barring injection of positive holes into said photoconductive layer. Accordingly, in case of the photoconductive member as shown in FIG. 1, it has a specific polarity and only negative charging can be employed when said member surface is subjected to charging treatment.

The surface barrier layer 103 may be constituted of any of ⓐ an amorphous material containing boron atoms (B) and hydrogen atoms (H) [hereinafter referred to as a—$B_xH_{1-x}$ (wherein $0<x<1$)], ⓑ an amorphous material containing boron atoms (B) and halogen atoms (X) [hereinafter referred to as a—$B_yX_{1-y}$ (wherein $0<y<1$)] or ⓒ an amorphous material containing boron atoms (B), hydrogen atoms (H) and halogen atoms (X) [hereinafter referred to as a—$B_\alpha(H_\beta X_{1-\beta})_{1-\alpha}$ (wherein $0<\alpha<1$, $0<\beta<1$)]. In the following, the amorphous materials represented by ⓐ, ⓑ and ⓒ as mentioned above is expressed compreshensively as "a—B(H, X)".

The surface barrier layer 103 constituted of a—B(H, X) may be formed preferably by the glow discharge method as described below. That is, using $B_2H_6$, $BF_3$, $BCl_3$ as the starting gases, which may be admixed, if necessary, with a diluting gas at a desired mixing ratio, are introduced into the chamber for vacuum deposition in which the support 101 is placed, and the gas introduced is converted to a gas plasma by excitation of glow discharge in the chamber thereby to deposit the aforesaid amorphous material on the photoconductive layer 102 formed already on the support 101.

If necessary, it is also possible to dope atoms of the Group II (e.g. Be) in the Periodic table or atoms of the Group IV (e.g. Si, C) in the Periodic table into the above mentioned surface barrier layer 103.

In forming the surface barrier layer 103 constituted of a—B(H, X) on the surface of the photoconductive layer 102, the support temperature during the layer formation is an important factor affecting the structure and characteristics of the layer formed. In the present invention, the support temperature during the layer formation is severely controlled so that a—B(H, X) having the intended characteristics may be prepared exactly as desired.

In order that the objects of the present invention may be achieved effectively, the support temperature during formation of the surface barrier layer 103, is generally 20° to 350° C., preferably 150° to 300° C.

The discharging power condition for preparing effectively with good productivity the a—B(H, X) having the characteristics to achieve the objects of the present invention is generally 2 W to 100 W, preferably 5 W to 50 W.

The contents of hydrogen atoms and halogen atoms in the surface barrier layer in the photoconductive member of this invention are also important factors for preparation of the surface barrier layer having the desired characteristics.

The content of hydrogen atoms or halogen atoms in the surface barrier layer in this invention may generally 1 to 50 atomic %, preferably 5 to 40 atomic %, most preferably 10 to 40 atomic %. Namely, in terms of representation by x in the above a—$B_xH_{1-x}$ or by y in the a—$B_yX_{1-y}$, x and y each are generally 0.99 to 0.5 preferably 0.95 to 0.6, most preferably 0.9 to 0.6. When both hydrogen atoms and halogen atoms are contained in the surface barrier layer, the total content of hydrogen atoms and halogen atoms is generally 1 to 50 atomic %, preferably 5 to 40 atomic %. In terms of representation by $\alpha$, $\beta$ in the above a—$B_\alpha(H_\beta X_{1-\beta})_{1-\alpha}$, $\alpha$ is generally 0.99 to 0.5, preferably 0.95 to 0.6 and $\beta$ is generally 0.98 to 0.2, preferably 0.9 to 0.4.

The numerical range of the layer thickness of the surface barrier layer 103 according to the present invention is also another important factor to achieve effectively the object of this invention.

That is, if the layer thickness of the surface barrier layer 103 is too thin, the function of barring injection of surface charges from the surface into the photoconductive layer 102 cannot sufficiently be fulfilled. On the contrary, if the thickness is too thick, lowering of injection preventive ability may be invited or the probability of the photocarriers to pass through the barrier layer and recombine with surface charges is very small. Thus, in any of the cases, the objects of this invention cannot effectively be achieved.

The layer thickness of the surface barrier layer 103 to achieve effectively the objects of this invention is generally in the range of from 30 Å to 1$\mu$, preferably from 50 Å to 5000 Å, most preferably from 50 Å to 1000 Å.

In the present invention, in order to achieve its objects, the photoconductive layer 102 formed on the support 101 is constituted of a—Si(H, X) having the semiconductor characteristics as shown below.

① p-type a—Si(H, X) . . . Containing only acceptor; or containing both donor and acceptor with relatively higher concentration of acceptor;

② $p^-$-type a—Si(H, X) . . . In the type of ①, that containing acceptor at relatively lower concentration;

③ n-type a—Si(H, X) . . . Containing only donor; or containing both donor and acceptor with relatively higher concentration of donor;

④ $0\ n^-$-type a—Si(H, X) . . . In the type of ③, that containing donor at relatively lower concentration;

⑤ i-type a—Si(H, X) . . . Na≃Nd≃0 or NA≃Nd.

In the present invention, typical examples of halogen atoms (X) to be incorporated in the photoconductive layer 102 are fluorine, chlorine, bromine and iodine, especially preferably fluorine and chlorine.

In the present invention, formation of a photoconductive layer 102 constituted of a—Si(H, X) may be conducted according to the vacuum deposition method utilizing discharging phenomenon, such as the glow discharge method, the sputtering method or the ion-plating method. For example, for formation of a photoconductive layer constituted of a—Si(H, X) according to the glow discharge method, a starting gas for incorporation of hydrogen atoms (H) or/and halogen atoms (X) is introduced together with a starting gas for supplying silicon atoms (Si) into the deposition chamber which can be internally brought to reduced pressure, wherein glow discharge is generated thereby to form a layer of a—Si(H, X) on the surface of a support placed at a predetermined position in the chamber. When it is to be formed according to the sputtering method, a starting gas for incorporation of hydrogen atoms (H) or/and halogen atoms (X) may be introduced into the chamber for sputtering, when effecting sputtering upon the target formed of silicon (Si) in an atmosphere of an inert gas such as Ar, He, etc. or a gas mixture based on these gases.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during formation and efficiency for supplying Si.

As the effective starting gas for incorporation of halogen atoms to be used in the present invention, there may be mentioned a number of halogen compounds such as halogen gases, halides, interhalogen compounds and silane derivatives substituted by halogens which are gaseous or gasifiable.

Alternatively, it is also effective in the present invention to use a gaseous or gasifiable silicon compound containing halogen atoms which is constituted of both silicon atoms and halogen atoms.

Typical examples of halogen compounds preferably used in the present invention may include halogen gases such as of fluorine, chlorine, bromine or iodine and interhalogen compounds such as BrF, ClF, $ClF_3$, $BrF_5$, $BrF_3$, $IF_3$, $IF_7$, ICl, IBr, etc.

As the silicon compound containing halogen atom, so-called silane derivatives substituted by halogen, silicon halides such as $SiF_4$, $Si_2F_6$, $SiCl_4$, $SiBr_4$, or the like are preferred.

When the specific photoconductive member of this invention is formed according to the glow discharge method by use of such a silicon compound containing halogen atoms, it is possible to form a photoconductive layer constituted of a—Si:X on a given support without use of a hydrogenated silicon gas as the starting gas capable of supplying Si.

In forming the photoconductive layer 102 containing halogen atoms according to the glow discharge method, the basic procedure comprises feeding a starting gas for supplying Si, namely a gas of silicon halide and a gas such as Ar, $H_2$, He, etc. at a predetermined ratio in a suitable amount into the deposition chamber for formation of a photoconductive layer, followed by excitation of glow discharge to form a plasma atmosphere of these gases, thereby forming a photoconductive layer on a support. It is also possible to form a layer by mixing a gas of a silicon compound containing hydrogen atoms at a suitable ratio with these gases in order to incorporate hydrogen atoms therein.

Each of the gases for introduction of respective atoms may be either a single species or a mixture of plural species at a predetermined ratio.

For formation of a photoconductive layer of a—Si(H, X) by the reaction sputtering method or the ion-plating method, for example, a target of Si is used and sputtering is effected thereon in a suitable gas plasma atmosphere in case of the sputtering method. Alternatively, in case of ion-plating method, a polycrystalline or single crystalline silicon is placed as vaporization source in a vapor deposition boat, and the silicon vaporization source is vaporized by heating by resistance heating method or electron beam method (EB method) thereby to permit vaporized flying substances to pass through a suitable gas plasma atmosphere.

During this procedure, in either of the sputtering method or the ion-plating method, for incorporation of halogen atoms into the layer formed, a gas of a halogen compound as mentioned above or a silicon compound containing halogen as mentioned above may be introduced into the deposition chamber to form a plasma atmosphere of said gas therein.

When hydrogen atoms are to be incorporated, a starting gas for incorporation of hydrogen atoms, for example, $H_2$ or a gas such as silanes as mentioned above may be introduced into the deposition chamber for sputtering, followed by formation of a plasma atmosphere of said gases.

In the present invention, as the starting gas for introduction of halogen atoms, the halogen compounds or silicon compounds containing halogens as mentioned above can effectively be used. In addition, it is also possible to use a gaseous or gasifiable halide containing hydrogen atom as one of the constituents such as hydrogen halide, including HF, HCl, HBr, HI and the like or halogen-substituted hydrogenated silicons, including $SiH_2F_2$, $SiH_2I_2$, $SiH_2Cl_2$, $SiHCl_3$, $SiH_2Br_2$, $SiHBr_3$ and the like as an effective starting material for formation of a photoconductive layer.

These halides containing hydrogen atom, which can also introduce hydrogen atoms very effective for controlling electrical or optical characteristics into the layer during formation of the photoconductive layer simultaneously with introduction of halogen atoms, can preferably be used as the starting material for incorporation of halogen atoms.

For incorporation of hydrogen atoms structurally into the photoconductive layer, $H_2$ or a gas of hydrogenated silicon, including $SiH_4$, $Si_2H_6$, $Si_3H_8$, $Si_4H_{10}$ and so on may be permitted to be co-present with a silicon compound for supplying Si in a deposition chamber, wherein discharging is excited.

For example, in case of the reaction sputtering method, a—Si target is used and a gas for introduction of halogen atoms and $H_2$ gas are introduced together with, if necessary, an inert gas such as He, Ar, etc. into a deposition chamber, wherein a plasma atmosphere is formed to effect sputtering of said Si target, thereby forming a photoconductive layer of a—Si(H, X) on the substrate.

Further, there may also be introduced a gas such as of $B_2H_6$, $PH_3$, $PF_3$ or others in order to effect also doping of impurities.

The amount of hydrogen atoms (H) or halogen atoms (X) incorporated in the photoconductive layer in the photoconductive member according to the present invention, or total amount of both of these atoms, may be generally 1 to 40 atomic %, preferably 5 to 30 atomic %.

For controlling the amounts of hydrogen atoms (H) or/and halogen atoms (X) in the photoconductive layer, the deposition support temperature or/and the amounts of the starting materials for incorporation of hydrogen atoms (H) or halogen atoms (X) to be introduced into the deposition device system or the discharging power may be controlled.

In order to make the photoconductive layer n-type, p-type or i-type, n-type impurity, p-type impurity or both impurities can be added into the layer in a controlled amount during formation of the layer by the glow discharge method or the reaction sputtering method.

As the impurity to be added into the photoconductive layer to make it p-type, there may be mentioned preferably an element of the Group III-A in the Periodic table, for example, B, Al, Ga, In, Tl, etc.

As n-type, impurities there may preferably be used an element of the Group V-A in the Periodic table, such as N, P, Sb, Bi, etc.

The impurities as described above are contained in the layer in an amount of the order of ppm, and therefore it is not necessary to pay such a great attention to the environmental pollution caused thereby as in case of the principal ingredients constituting the charge transport layer, but it is also preferable to use a substance which is as less pollutive as possible. From such a standpoint, also in view of the electrical and optical characteristics of the layer formed, a material such as B, Ga, P, Sb, and the like is most preferred. In addition, for example, it is also possible to control the layer to n-type by interstitial doping of Li or others through thermal diffusion or implantation. The amount of the impurity to be added into the photoconductive layer, which is determined suitably depending on the electrical and optical characteristics desired, but in the range of an impurity of the Group III-A in the Periodic table, generally up to $5 \times 10^{-3}$ atomic % to make the layer $n^-$-type, i-type or $p^-$-type, and in the range of an impurity of the Group III-A from $5 \times 10^{-3}$ to $3 \times 10^{-2}$ atomic % to make the layer p-type. In order to make the layer n-type, an impurity of the Group V-A in the Periodic table, in an amount of $5 \times 10^{-3}$ atomic % or less is desirably added.

The layer thickness of the photoconductive layer in the photoconductive member according to the present invention may suitably be determined as desired in conformity with the purpose of application such as reading device, image pick-up device or image-forming member for electrophotography.

In the present invention, the layer thickness of the photoconductive layer is determined suitably in relation to the thickness of the surface barrier layer so that both functions of the photoconductive layer and the function of the barrier layer may effectively be exhibited respectively to achieve effectively the objects of the present invention. Usually, the layer thickness of the photoconductive layer may preferably be some hundred to some thousand times as thick as that of the surface barrier layer.

Alternatively, the layer thickness of the photoconductive layer may be determined suitably as desired so that the photocarriers injected may be generated efficiently and transported efficiently in a certain direction, but is generally in the range from 3 to $100\mu$ preferably from 5 to $50\mu$.

In the present invention, the photoconductive layer 102 can be one having relatively lower resistivity, since there is provided the surface barrier layer 103 constituted of the amorphous material as described above. But, for obtaining better results, the dark resistance of the photoconductive layer 102 formed may preferably be $5 \times 10^9$ ohm.cm or more, most preferably $10^{10}$ ohm.cm or more.

In particular, the numerical condition for the dark resistance values is an important factor when using the prepared photoconductive member as an image-forming member for electrophotography, as a high sensitive reading device or an image pick-up device to be used under low illuminance regions, or as a photoelectric convertor.

Figure 2:
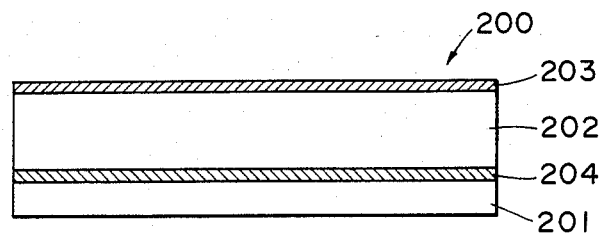

FIG. 2 shows a schematic sectional view for illustration of the layer structure of the second embodiment of the photoconductive member of this invention.

The photoconductive member 200 as shown in FIG. 2 comprises a support 201 for photoconductive member, a lower barrier layer 204 on the support, a photoconductive layer 202 provided in direct contact with said barrier layer 204 and an upper barrier layer 203.

That is, the layer structure as shown in FIG. 2 has a lower barrier layer 204 in addition to the layer structure of the photoconductive member as described with reference to FIG. 1.

The lower barrier layer 204 has the function to bar effectively injection of free carriers from the side of the support 201 in the direction toward the side of the photoconductive layer 202 and permit photocarriers, which are generated in the photoconductive layer on irradiation of an electromagnetic wave and migrated toward the side of the support 201, to pass easily from the side of the photoconductive layer 202 to the side of the support 201.

The lower barrier layer is constituted of a matrix of silicon atoms containing at least one selected from carbon atoms (C), nitrogen atoms (N) and oxygen atoms (O), further containing, if necessary, at least one of hydrogen atoms and halogen atoms [these are represented comprehensively by a—$[Si_\gamma(C, N, O)_{1-\gamma}]_\delta(H, X)_{1-\delta}$ (where $0<\gamma<1$, $0<\delta<1$)]; or an electrically insulating metal oxide.

In the present invention, as halogen atoms (X) contained in the amorphous material constituting the above lower barrier layer, F, Cl, Br, I, especially F and Cl are preferred.

Typical examples of the amorphous materials effectively used in the present invention for constitution of the above lower barrier layer 204 may include carbon type amorphous materials as exemplified by a—$Si_aC_{1-a}$, a—$(Si_bC_{1-b})_cH_{1-c}$, a—$(Si_dC_{1-d})_eX_{1-e}$, a—$(Si_fC_{1-f})_g(H+X)_{1-g}$; nitrogen type amorphous materials as exemplified by a—$Si_hN_{1-h}$, a—$(Si_iN_{1-i})_jH_{1-j}$, a—$(Si_kN_{1-k})_lX_{1-l}$, a—$(Si_mN_{1-m})_n(H+X)_{1-n}$; oxygen type amorphous materials as exemplified by a—$Si_oO_{1-o}$, a—$(Si_pO_{1-p})_qH_{1-q}$, a—$(Si_rO_{1-r})_sX_{1-s}$, a—$(Si_tO_{1-t})_u(H+X)_{1-u}$; and the like; and further amorphous materials containing at least two kinds of atoms of carbon atoms (C), nitrogen atoms (N) and oxygen atoms (O) as constituent atoms in the above amorphous materials (wherein $0<$ a, b, c, d, e, f, g, h, i, j, k, l, m, n, o, p, q, r, s, t, u, $<1$).

These amorphous materials are chosen optimally depending on the characteristics required for the lower barrier layer 204 according to the optimum design of the layer structure and the easiness in subsequent preparation of the photoconductive layer 202 and the surface barrier layer 203 which are layered on said lower barrier layer 204. In particular, from aspects of characteristics it is preferred to choose a carbon type or a nitrogen type amorphous material.

The lower barrier layer 204 constituted of the above amorphous material may be formed by the glow discharge method, the sputtering method, the ion implantation method, the ion-plating method, the electron-beam method or the like. These production methods are suitably selected depending on the factors such as production conditions, the degree of loading of installation capital investment, production scale, the desirable characteristics of the photoconductive members to be prepared, etc. But the glow discharge method or the sputtering method may preferably be adopted for the advantages of easy control of the conditions for preparation of a photoconductive member having desirable characteristics as well as easy incorporation of other necessary atoms such as carbon atoms, nitrogen atoms, oxygen atoms or hydrogen atoms, and halogen atoms together with silicon atoms into the lower barrier layer 204 prepared.

Further, in the present invention, the glow discharge method and the sputtering method may be employed in combination in the same device system to form the lower barrier layer 204.

For formation of the lower barrier layer 204 according to the glow discharge method, the starting gases for formation of the aforesaid amorphous material, which may be admixed, if necessary, with a diluting gas at a desired mixing ratio, are introduced into the chamber for vacuum deposition in which the support 201 is placed, and the gas introduced in converted to a gas plasma by excitation of glow discharge in the chamber thereby to deposit the aforesaid amorphous material on the support 201.

The substance effectively used as the starting materials for formation of the lower barrier layer 204 with a carbon type amorphous material in the present invention may include silicon hydride gases constituted of silicon atoms (Si) and hydrogen atoms (H) such as silanes, as exemplified by $SiH_4$, $Si_2H_6$, $Si_3H_8$, $Si_4H_{10}$, etc., hydrocarbons constituted of carbon atoms (C) and hydrogen atoms (H) such as saturated hydrocarbons having 1 to 5 carbon atoms, ethylenic hydrocarbons having 2 to 5 carbon atoms or acetylenic hydrocarbons having 2 to 4 carbon atoms.

More specifically, typical examples are saturated hydrocarbons such as methane ($CH_4$), ethane ($C_2H_6$), propane ($C_3H_8$), n-butane (n-$C_4H_{10}$), pentane ($C_5H_{12}$) and the like; ethylenic hydrocarbons such as ethylene ($C_2H_4$), propylene ($C_3H_6$), butene-1 ($C_4H_8$), butene-2 ($C_4H_8$), isobutylene ($C_4H_8$), pentene ($C_5H_{10}$) and the like; and acetylenic hydrocarbons such as acetylene ($C_2H_2$), methylacetylene ($C_3H_4$), butyne ($C_4H_6$) and the like.

Typical examples of the starting gas having silicon atoms (Si), carbon atoms (C) and hydrogen atoms (H) as constituent atoms are alkyl silanes such as $Si(CH_3)_4$, $Si(C_2H_5)_4$ and the like. In addition to these starting gases, $H_2$ can of course be effectively used as the starting gas for incorporation of hydrogen atoms (H).

The starting gases for incorporation of halogen atoms (X) for constitution of the lower barrier layer 204 with a carbon type amorphous material containing halogen atoms (X) may include single substances of halogen, hydrogen halides, interhalogen compounds, silicon halides, halogen-substituted silicon hydrides, etc.

More specifically, there may be included simple substances of halogen such as halogenic gases of fluorine, chlorine, bromine and iodine; hydrogen halides such as HF, HI, HCl, HBr, etc.; interhalogen compounds such as BrF, ClF, $ClF_3$, $ClF_5$, $BrF_5$, $IF_7$, $IF_5$, ICl, IBr, etc.; silicon halides such as $SiF_4$, $Si_2F_6$, $SiCl_4$, $SiCl_3Br$, $SiCl_2Br_2$, $SiClBr_3$, $SiCl_3I$, $SiBr_4$, etc.; halogen-substituted hydrogenated silicons such as $SiH_2F_2$, $SiH_2Cl_2$, $SiHCl_3$, $SiH_3Cl$, $SiH_3Br$, $SiH_2Br_2$, $SiHBr_3$.

In addition to those mentioned above, there are halogen-substituted paraffinic hydrocarbons such as $CCl_4$, CHF$_3$, CH$_2$F$_2$, CH$_3$F, CH$_3$Cl, CH$_3$Br, CH$_3$I, C$_2$H$_5$Cl, etc; fluorinated sulfur compounds such as SF$_4$, SF$_6$, etc.; and halogen-containing alkyl silanes such as SiCl(CH$_3$)$_3$, SiCl$_2$(CH$_3$)$_2$, SiCl$_3$CH$_3$, etc.

These substances for forming the lower barrier layer are chosen as desired and used in formation of a lower barrier layer so that silicon atoms, carbon atoms and, if necessary, halogen atoms and hydrogen atoms may be contained at a desirable composition in the lower barrier layer formed.

For example, Si(CH$_3$)$_4$, which can easily accomplish incorporation of silicon atoms, carbon atoms and hydrogen atoms and form a barrier layer with desirable characteristics, and SiHCl$_3$, SiCl$_4$, SiH$_2$Cl$_2$ or SiH$_3$Cl, as a substance for incorporation of halogen atoms, may be introduced at a predetermined mixing ratio in a gaseous state into a device for formation of a barrier layer, in which glow discharge is excited to form a barrier layer constituted of a—(Si$_f$C$_{1-f}$)$_g$(X+H)$_{1-g}$.

In the present invention, when the glow discharge method is adopted for constituting the lower barrier layer 204 with a nitrogen type amorphous material, desired substances selected from those mentioned above for formation of the lower barrier layer may be used in combination with a starting gas for incorporation of nitrogen atoms. That is, as the starting materials for incorporation of nitrogen atoms for formation of the lower barrier layer 204, there may be mentioned, gaseous or gasifiable nitrogen compounds constituted of nitrogen atoms (N) or nitrogen atoms (N) and hydrogen atoms (H) such as nitrogen, nitrides and azides, including for example, nitrogen (N$_2$), ammonia (NH$_3$), hydrazine (H$_2$NNH$_2$), hydrogen azide (HN$_3$) ammonium azide (NH$_4$N$_3$), and so on. In addition, it is also possible to use a nitrogen halide compound which can incorporate both nitrogen atoms and halogen atoms, such as nitrogen trifluoride (F$_3$N), nitrogen tetrafluoride (F$_4$N$_2$).

When the glow discharge method is adopted for constituting the lower barrier layer 204 with an oxygen type amorphous material, a desirable substance is selected from the those for formation of the lower barrier layer 204 as mentioned above and a starting material which can be a starting gas for supplying oxygen atoms may be used in combination. As such starting materials for incorporation of oxygen atoms, there may be employed most of gaseous substances or gasified gasifiable substances containing oxygen atoms as constituent atoms.

For example, it is possible to use a mixture of a starting gas having silicon atoms (Si) as constituent atoms, a starting gas having oxygen atoms (O) as constituent atoms and, if necessary, a gas having hydrogen atoms (H) and/or halogen atoms (X) as constituent atoms at a desired mixing ratio. Alternatively, a mixture of a starting gas having silicon atoms (Si) as constituent atoms and a starting gas having oxygen atoms (O) and hydrogen atoms (H) as constituent atoms at a desired mixing ratio can also be used. Further, it is also possible to use a mixture of a starting gas having silicon atoms (Si) as constituent atoms and a starting gas having the three atoms of silicon atoms (Si), oxygen atoms (O) and hydrogen atoms (H) as constituent atoms.

As another method, it is also possible to use a mixture of a starting gas having silicon atoms (Si) and hydrogen atoms (H) as constituent atoms and a starting gas having oxygen atoms (O) as constituent atoms.

More specifically, there may be mentioned oxygen (O$_2$), ozone (O$_3$), carbon monoxide (CO), carbon dioxide (CO$_2$), nitrogen monoxide (NO), dinitrogen oxide (N$_2$O), nitrogen dioxide (NO$_2$), dinitrogen trioxide (N$_2$O$_3$), dinitrogen tetraoxide (N$_2$O$_4$), dinitrogen pentoxide (N$_2$O$_5$), nitrogen trioxide (NO$_3$), lower siloxanes containing Si, O and H as constituent atoms such as disiloxane (H$_3$SiOSiH$_3$), trisiloxane (H$_3$SiOSiH$_2$OSiH$_3$), and so on.

As described above, when forming a lower barrier layer 204 according to the glow discharge method, the starting materials for formation of the lower barrier layer 204 are suitably selected from the above-mentioned materials so that the lower barrier layer 204 having the required characteristics can be constituted by the required. For example, when using the glow discharge method, there may be employed a single gas such as Si(CH$_3$)$_4$ or SiCl$_2$(CH$_3$)$_2$, and the like, or a gas mixture such as SiH$_4$—N$_2$O system, SiH$_4$—O$_2$(—Ar) system, SiH$_4$—NO$_2$ system, SiH$_4$—O$_2$—N$_2$ system, SiCl$_4$—CO$_2$—H$_2$ system, SiCl$_4$—NO—H$_2$ system, SiH$_4$—NH$_3$ system, SiCl$_4$—NH$_4$ system, SiH$_4$—N$_2$ system, SiH$_4$—NH$_3$—NO system, Si(CH$_3$)$_4$—SiCl$_2$(CH$_3$)$_2$—SiH$_4$ system, etc. as the starting material for formation of the lower barrier layer 204.

For formation of the lower barrier layer 204 with a carbon type amorphous material by the sputtering method, a single crystalline or polycrystalline Si wafer or C wafer or a wafer containing Si and C mixed therein is used as target and subjected to sputtering in an atmosphere of various gases.

For example, when Si wafer is used as target, a starting gas for incorporation of carbon atoms and hydrogen atoms (H) or halogen atoms (X), which may be diluted with a diluting gas, if desired, is introduced into a deposition chamber for sputter to form a gas plasma therein and effect sputtering of said Si wafer.

Alternatively, Si and C as separate targets or one sheet target of a mixture of Si and C can be used and sputtering is effected in a gas atmosphere containing at least hydrogen atoms (H) or halogen atoms (X).

As the starting gas for incorporation of carbon atoms, or hydrogen atoms or halogen atoms, there may be employed those as mentioned in the glow discharge as described above as effective gases also in case of sputtering.

For formation of the lower barrier layer 204 with a nitrogen type amorphous material by the sputtering method, a single crystalline or polycrystalline Si wafer or Si$_3$N$_4$ wafer or a wafer containing Si and Si$_3$N$_4$ mixed therein is used as target and subjected to sputtering in an atmosphere of various gases.

For example, when Si wafer is used as target, a starting gas for incorporation of nitrogen atoms and, if necessary, hydrogen atoms or/and halogen atoms, such as H$_2$ and N$_2$ or NH$_3$, which may be diluted with a diluting gas, if desired, is introduced into a deposition chamber for sputter to form a gas plasma therein and effect sputtering of said Si wafer.

Alternatively, Si and Si$_3$N$_4$ as separate targets or one sheet target of a mixture of Si and Si$_3$N$_4$ can be used and sputtering is effected in a diluted gas atmosphere as a gas for sputter or a gas atmosphere containing at least hydrogen atoms (H) or halogen atoms (X).

As the starting gas for incorporation of nitrogen atoms, there may be employed those for formation of the barrier layer as mentioned in the glow discharge as described above as effective gases also in case of sputtering.

For formation of the lower barrier layer 204 with an oxygen type amorphous material by the sputtering method, a single crystalline or polycrystalline Si wafer or SiO₂ wafer, or a wafer containing Si and SiO₂ mixed therein is used as target and subjected to sputtering in an atmosphere of various gases.

For example, when Si wafer is used as target, a starting gas for incorporation of oxygen atoms and, if necessary hydrogen atoms or/and halogen atoms, which may be diluted with a diluting gas, if desired, is introduced into a deposition chamber for sputter to form a gas plasma therein and effect sputtering of said Si wafer. Alternatively, Si and SiO₂ as separate targets or one sheet target of a mixture of Si and SiO₂ can be used and sputtering is effected in a gas atmosphere of a diluting gas as a gas for sputtering or in a gas atmosphere containing at least hydrogen atoms (H) or/and halogen atoms (X) as constituent elements. As the starting gas for incorporation of oxygen atoms, there may be employed those as mentioned in the glow discharge as described above as effective gases also in case of sputtering.

In the present invention, as the diluting gas to be employed in forming the lower barrier layer 204 according to the glow discharge method or the sputtering method, there may included so-called rare gases such as He, Ne, Ar, etc. as suitable ones.

The lower barrier layer 204 in the present invention is formed carefully so that the characteristics required may be given exactly as desired.

That is, a substance constituted of silicon atoms (Si) and at least one of carbon atoms (C), nitrogen atoms (N) and oxygen atoms (O), and optionally hydrogen atoms (H) or/and halogen atoms (X) can take various forms from crystalline to amorphous electrical properties from conductive through semi-conductive to insulating, and photoconductive properties from photoconductive to non-photoconductive depending on the preparation conditions. In the present invention, the preparation conditions are severely selected so that there may be formed amorphous materials being non-photoconductive at least with respect to the light in so-called visible region.

Since the function of the lower barrier layer 204 is to bar injection of free carriers from the side of the support 201 into the photoconductive layer 202, and permit easily the photocarriers generated in the photoconductive layer 202 to be migrated and passed therethrough to the side of the support 201, the amorphous material constituting the lower barrier layer 204 is desirably formed so as to exhibit electrically insulating behaviours.

The barrier layer 204 is formed also to have a mobility value with respect to passing carriers to the extent that passing of photocarriers generated in the photoconductive layer 202 may be smoothly passed through the lower barrier layer 204.

As a critical element in the conditions for preparation of the lower barrier layer 204 of the aforesaid amorphous material having the characteristics as described above, there may be mentioned the support temperature during preparation of the layer.

That is, in forming the lower barrier layer 204 constituted of the aforesaid amorphous material on the surface of the support 201, the support temperature during the layer formation is an important factor affecting the structure and characteristics of the layer formed. In the present invention, the support temperature during the layer formation is severely controlled so that the aforesaid amorphous material having the intended characteristics may be prepared exactly as desired.

In order that the objects of the present invention may be achieved effectively, the support temperature during formation of the lower barrier layer 204 is selected optimally within the range depending on the method for formation of the lower barrier layer 204, and may generally in the range of 100° C. to 300° C., preferably 150° C. to 250° C., in a system containing hydrogen atoms or halogen atom. For formation of the lower barrier layer 204, it is possible to form subsequently in the same system from the lower layer 204 to the photoconductive layer, further to the surface barrier layer 203. It is advantageous to adopt the glow discharge method or sputtering method, because of relatively easier severe control of the composition of the atoms constituting respective layers and their layer thicknesses. When the lower barrier layer 204 is to be formed according to these layer forming methods, the discharging power and gas pressure during layer formation may be mentioned as important factors influencing the characteristics of the lower barrier layer 204 similarly as the support temperature as described above.

The discharging power conditions for preparing effectively with good productivity the lower barrier layer 204 having the characteristics to achieve the objects of the present invention is generally 1 to 300 W, preferably 2 to 150 W. As to the gas pressure in the deposition chamber, it is generally $3 \times 10^{-3}$ Torr, preferably about $8 \times 10^{-3}$ Torr to 0.5 Torr.

The contents of carbon atoms, nitrogen atoms, oxygen atoms, hydrogen atoms, and halogen atoms in the lower barrier layer 204 in the photoconductive member of this invention are also important factors for forming a barrier having the desired characteristics to achieve the objects of the present invention, in analogy with the conditions for preparing the lower barrier layer 204.

When the lower barrier layer 204 is constituted of a—$Si_aC_{1-a}$, the content of carbon atoms based on silicon atoms is 60 to 90 atomic %, preferably 65 to 80 atomic %, most preferably 70 to 75 atomic %, namely in terms of representation by a, being 0.1 to 0.4, preferably 0.2 to 0.35, most preferably, 0.25 to 0.3. In case of a—($Si_bC_{1-b})_cH_{1-c}$, the content of carbon atoms is generally 30 to 90 atomic %, preferably 40 to 90 atomic %, most preferably 50 to 80 atomic %, the content of hydrogen atoms is generally 1 to 40 atomic %, preferably 2 to 35 atomic %, most preferably 5 to 30 atomic %, namely in terms of representation by b and c, b being generally 0.1 to 0.5, preferably 0.1 to 0.35, most preferably 0.15 to 0.3 and c being 0.60 to 0.99, preferably 0.65 to 0.98, most preferably 0.7 to 0.95. In case of a—($Si_dC_{1-d})_eX_{1-e}$ or a—($Si_fC_{1-f})_g(H+X)_{1-g}$, the content of carbon atoms is generally 40 to 90 atomic %, preferably 50 to 90 atomic %, most preferably 60 to 80 atomic %, the content of halogen atoms or the total content of halogen atoms and hydrogen atoms is generally 1 to 20 atomic %, preferably 1 to 18 atomic %, most preferably 2 to 15 atomic %, and the hydrogen atom content when both halogen atoms and hydrogen atoms are contained is generally 19 atomic % or less, preferably 13 atomic % or less, namely in terms of representation by d, e, f and g, d or f being generally 0.1 to 0.47, preferably 0.1 to 0.35, most preferably 0.15 to 0.3 and e or g being generally 0.8 to 0.99, preferably 0.85 to 0.99, most preferably 0.85 to 0.98.

When the lower barrier layer 204 is constituted of a nitrogen type amorphous material, first in case of a—$Si_hN_{1-h}$, the content of nitrogen atoms is generally 43 to 60 atomic %, based on silicon atoms, preferably 43 to 50 atomic %, namely generally 0.43 to 0.60, preferably 0.43 to 0.50 in terms of h.

In case of a—$(Si_iN_{1-i})_jH_{1-j}$ the content of nitrogen atoms is generally 25 to 55 atomic %, preferably 35 to 55 atomic %, the content of hydrogen atoms is generally 2 to 35 atomic %, preferably 5 to 30 atomic %, namely in terms of representation by i and j, i being generally 0.43 to 0.6, preferably 0.43 to 0.5, and j being 0.65 to 0.98, preferably 0.7 to 0.95. In case of a—$(Si_kC_{1-k})_lX_{1-l}$ or a—$(Si_mC_{1-m})_n(H+X)_{1-n}$, the content of nitrogen atoms is generally 30 to 60 atomic %, preferably 40 to 60 atomic %, the content of halogen atoms or the total content of halogen atoms and hydrogen atoms is generally 1 to 20 atomic %, preferably 2 to 15 atomic %, and the hydrogen atom content when both halogen atoms and hydrogen atoms are contained is generally 19 atomic % or less, preferably 13 atomic % or less, namely in terms of representation by k, l, m and n, k or m being generally 0.43 to 0.60, preferably 0.43 to 0.49 and l or n being generally 0.8 to 0.99, preferably 0.85 to 0.98.

When the lower barrier layer 204 is constituted of an oxygen type amorphous material, first in case of a—$Si_oN_{1-o}$, the content of oxygen atoms is generally 60 to 67 atomic %, based on silicon atoms, preferably 63 to 67 atomic %, namely generally 0.33 to 0.40, preferably 0.33 to 0.37 in terms of o.

In case of a—$(Si_pO_{1-p})_qH_{1-q}$, the content of oxygen atoms is generally 39 to 66 atomic %, preferably 42 to 64 atomic %, and the content of hydrogen atoms generally 2 to 35 atomic %, preferably 5 to 30 atomic %, namely in terms of representation by p and q, p being generally 0.33 to 0.40, preferably 0.33 to 0.37 and q generally 0.65 to 0.98, preferably 0.70 to 0.95.

When the lower barrier layer 204 is constituted of a—$(Si_rO_{1-r})_sX_{1-s}$ or a—$(Si_tO_{1-t})_u(H+X)_{1-u}$, the content of oxygen atoms is generally 48 to 66 atomic %, preferably 51 to 66 atomic %, the content of halogen atoms or the total content of halogen atoms and hydrogen atoms generally 1 to 20 atomic %, preferably 2 to 15 atomic %, and the content of hydrogen atoms when both halogen atoms and hydrogen atoms are contained is 19 atomic % or less, preferably 13 atomic % or less. As represented in terms of r, s, t and u, r or t is generally 0.33 to 0.40, preferably 0.33 to 0.37, and s or u generally 0.80 to 0.99, preferably 0.85 to 0.98.

In the present invention, as the electrically insulating metal oxides for constituting the lower barrier layer 204, there may preferably be mentioned $TiO_2$, $Ce_2O_3$, $ZrO_2$, $HfO_2$, $GeO_2$, CaO, BeO, $P_2O_5$, $Y_2O_3$, $Cr_2O_3$, $Al_2O_3$, MgO, $MgO \cdot Al_2O_3$, $SiO_2 \cdot MgO$, etc. A mixture of two or more kinds of these compounds may also be used to form the lower barrier layer.

The lower barrier layer 204 constituted of an electrically insulating metal oxide may be formed by the vacuum deposition method, the CVD (chemical vapor deposition) method, the glow discharge decomposition method, the sputtering method, the ion implantation method, the ion-plating method, the electron-beam method or the like. These preparation methods may be suitably selected depending on the preparation conditions, the degree of loading of capital investment, production scale, the desired characteristics of the photoconductive member to be prepared.

For formation of the lower barrier layer 204 by the sputtering method, for example, a wafer for formation of an barrier layer may be used as target and subjected to sputtering in an atmosphere of various gases such as He, Ne, Ar, etc.

When the electron-beam method is used, there is placed a starting material for formation of the lower barrier layer in a boat for deposition, which may in turn be irradiated by an electron-beam to effect vapor deposition of said material. Since the function of the lower barrier layer 204 of this invention is to bar injection of carriers from the side of the support 201 into the photoconductive layer 202, and permit easily the photocarriers generated in the photoconductive layer 202 to be migrated and passed therethrough to the side of the support 201, it is formed so as to exhibit electrically insulating behaviours.

The numerical range of the layer thickness of the lower barrier layer 204 is also another important factor to achieve effectively the object of this invention.

If the layer thickness of the lower barrier layer 204 is too thin, the function of barring injection of free carriers from the side of the support in the direction toward the photoconductive layer 202 cannot sufficiently be fulfilled. On the contrary, if the thickness is too thick, the probability of the photocarriers generated in the photoconductive layer 202 to be passed through the barrier layer to the side of the support 201 is very small. Thus, in any of the cases, the objects of this invention cannot effectively be achieved.

In view of the above points, the layer thickness of the lower barrier layer 204 to achieve effectively the objects of this invention is desired to be generally 30 to 1000 Å, preferably 50 to 600 Å.

Figure 3:
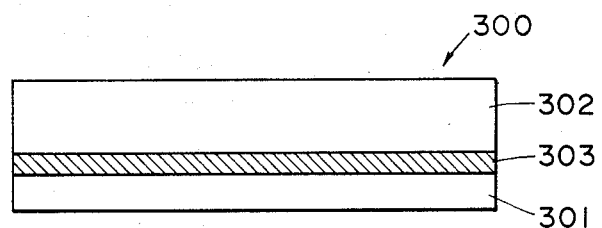

FIG. 3 shows a schematic sectional view for illustration of the third embodiment of the photoconductive member of this invention.

The photoconductive member 300 as shown in FIG. 3 has laminated an intermediate layer 303 and a photoconductive layer 302 on a support 301 for photoconductive member.

The intermediate layer 303 has the function to bar injection of free carriers from the side of the support 301 into the photoconductive layer 302, and may be formed on the support 301 using the same material and under the same preparation conditions as in the surface barrier 103 in the photoconductive member 100 shown in FIG. 1.

The numerical range of the layer thickness of the intermediate layer 303 of the photoconductive layer 300 shown in FIG. 3 is also another important factor to achieve effectively the object of this invention. That is, if the layer thickness of the intermediate layer is too thin, the function of barring injection of free carriers from the side of the support 301 in the direction on toward the photoconductive layer 302 cannot sufficiently be fullfilled. On the contrary, if the layer thickness is too thick, lowering of injection preventive ability may be invited or the probability of the photocarriers generated in the photoconductive layer 302 to be passed through the intermediate layer to the side of the support is very small. Thus, in any of the cases, the objects of this invention cannot effectively achieved.

For the above reasons, the layer thickness of the intermediate layer 303 to achieve effectively the objects of this invention is desired to be generally 30 Å to 1μ, preferably 50 to 5000 Å, most preferably 50 to 1000 Å.

Figure 4:
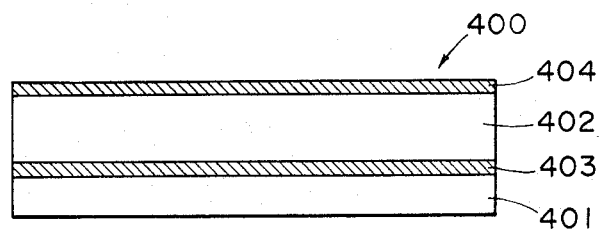

The photoconductive member 400 as shown in FIG. 4 is constituted of a support 401 for photoconductive member, an intermediate layer 403, a photoconductive layer 402 and a surface barrier layer 404 on the support.

That is, the photoconductive member as shown in FIG. 4 has the same layer structure as that described with reference to FIG. 3 except that the surface barrier is additionally provided.

The surface barrier layer 404 may be formed on the photoconductive layer 402 using the same material and under the same preparation conditions as the lower barrier layer 204 in the photoconductive member 200 as shown in FIG. 2.

The surface barrier layer 404 has the same function as the surface barrier layers described in FIG. 1 and FIG. 2 and desired to have a layer thickness in the same numerical range as those of said barrier layers.

EXAMPLE 1

Figure 5:
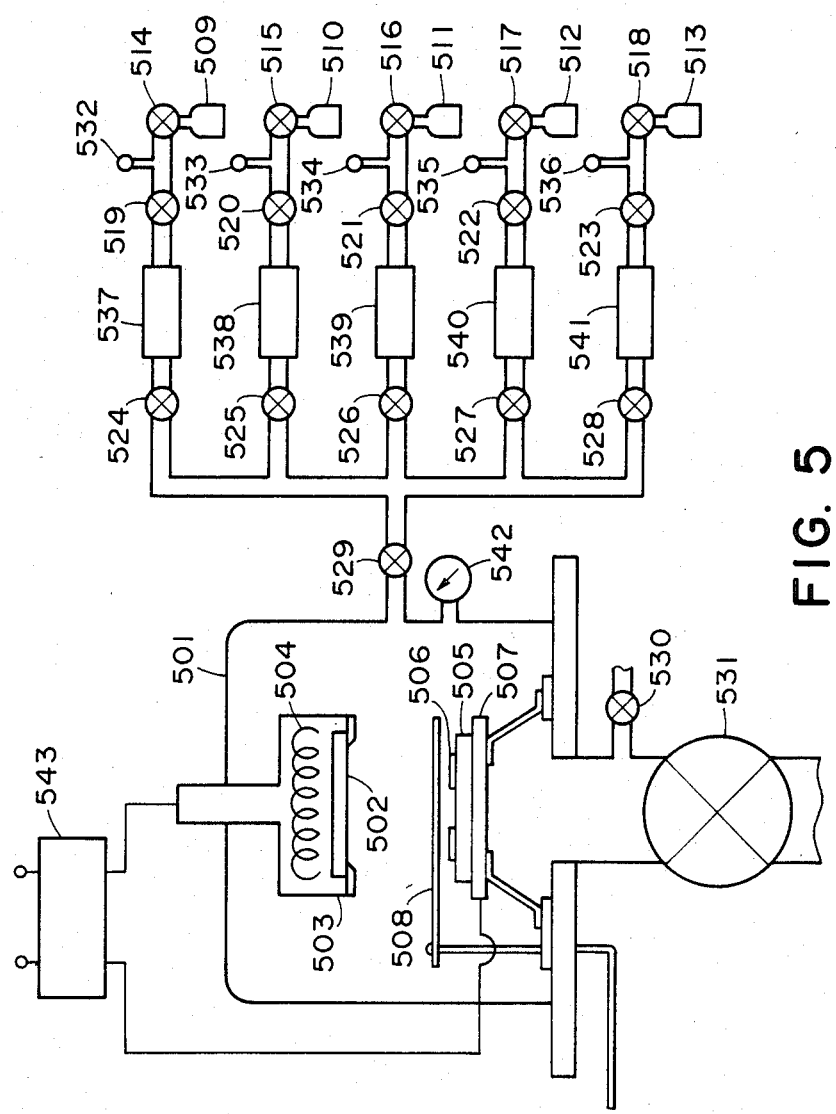
FIG. 5, a schematic flow chart for illustration of one example of the device for preparation of the photoconductive members according to the present invention.

Using a device as shown in FIG. 5 placed in a clean room which had been completely shielded, a photoconductive member having the layer structure as shown in FIG. 1 was prepared according to the following procedures.

A substrate of molybdenum 502 of 10 cm square having a thickness of 0.5 mm, whose surface had been cleaned, was fixed firmly on a supporting member 503 (which was also an electrode) disposed at a predetermined position in a deposition chamber 501. The target for sputter consisted of a high purity polycrystalline silicon (99.999%) 506 provided on a high purity graphite (99.999%) 505. The shutter 508 (which was also an electrode) was closed. The substrate 502 was heated by a heater 504 within the supporting member 503 with a precision of ±0.5° C. The temperature was measured directly at the backside of the substrate by an alumel-chromel thermocouple. Then, after confirming that all the valves in the system were closed, the main valve 531 was opened fully to evacuate once to about $5 \times 10^{-7}$ Torr (during this operation all the valves in the system were closed). Subsequently, the auxiliary valve 529, and then the outflow valves 524, 525, 526, 527, 528 were opened to remove sufficiently the gases in the flowmeters 537, 538, 539, 540 and 541. Then, the outflow valves 524, 525, 526, 527 and 528 were closed. The heater 504 was then turned on to set the substrate temperature at 250° C.

Then, the valve 514 of the bomb 509 containing SiH4 gas (purity: 99.999%) diluted with H2 to 10 vol. % [hereinafter referred to as SiH4(10)/H2] and the valve 515 of the bomb 510 containing B2H6 gas diluted with H2 to 100 vol. ppm [hereinafter referred to as B2H6(100)/H2] were respectively opened to adjust the pressures at the outlet pressure gages 532 and 533 respectively, to 1 Kg/cm2, whereupon the inflow valves 519, 520 were gradually opened to permit SiH4(10)/H2 gas and B2H6(100)/H2 gas to flow into the flowmeters 537 and 538, respectively. Subsequently, the outflow valves 524 and 525 were gradually opened, followed by opening of the auxiliary valve 529. The inflow valves 519 and 520 were adjusted thereby so that the gas feed ratio SiH4(10)/H2 to B2H6(100)/H2 was 100:1. Then, while carefully reading the Pirani gage 542, the opening of the auxiliary valve 529 was adjusted and it was opened to the extent until the inner pressure in the chamber 501 became $1 \times 10^{-2}$ Torr. After the inner pressure in the chamber 501 was stabilized, the main valve 531 was gradually closed to narrow its opening until the indication on the Pirani gage 542 became 0.5 Torr. After confirming that the gas feeding and the inner pressure were stabilized, the shutter 508 was closed and then the switch of high frequency power source 543 was turned on to input a high frequency power of 13.56 MHz between the supporting member 503 as an electrode and the shutter 508 as an electrode, thereby generating glow discharge in the chamber 501 to provide an input power of 10 W. After glow discharging was continued for about 10 hours to form a photoconductive layer having a layer thickness of about 15 μ, the high frequency power source 543 was turned off for intermission of glow discharging and the valves 514, 515 and 519, 520, further 524, 525 were closed, and the valve 531 was fully opened. After the chamber 501 was thoroughly evacuated, the valve 529 was once closed and the valve 516 of the bomb 511 containing B2H6 gas diluted with H2 to 5 vol. % [hereinafter referred to as B2H6(5)/H2] was opened to adjust the pressure at the outlet pressure gage 534 to 1 Kg/cm2, followed by opening of the inflow valve 521 to permit B2H6(5)/H2 gas to flow into the flowmeter 539. Subsequently, the outflow valve 526 was gradually opened and the inner pressure in the chamber 501 was maintained at $1 \times 10^{-2}$ Torr by adjusting the opening of the auxiliary valve 529. After the inner pressure in the chamber 501 was stabilized, the main valve 531 was gradually closed to narrow its opening until the indication on the Pirani gage 542 became 0.2 Torr. After confirming that the gas inflow and the inner pressure were stabilized, the high frequency power source 543 was turned on to input a high frequency power source between the supporting member 503 as an electrode and the shutter 508 as an electrode, thereby generating glow discharge at an input power of 20 W in the chamber 501. Glow discharging was continued to be maintained under these conditions for about 6 minutes to form a surface barrier layer, which had a thickness of about 400 Å. Finally, the heater 504 was turned off, with the high frequency power source 543 being also turned off, and the outflow valves 526 and the inflow valves 521 were closed, with the main valve 531 fully opened, thereby to make the inner pressure in the chamber 501 to less than $10^{-5}$ Torr. Then, upon cooling of the substrate to 50° C. the main valve 531 was closed, and the inner pressure in the chamber 501 was made atmospheric through the leak valve 530, and the substrate having respective layers formed thereon was taken out.

The thus prepared photoconductive member was placed in an experimental device for charging and exposure to light. Corona charging was effected at ⊖6.0 KV, and imagewise exposure was conducted by use of a halogen lamp as light source at a light quantity of about 1 lux·sec.

Immediately thereafter, positively (⊕) charged developers (containing toner and carrier) were cascaded on the surface of the photoconductive member to obtain a good toner image on the member. When the toner image on the photoconductive member was transferred onto a transfer paper by corona charging at ⊖5.0 KV, there was obtained a clear image which was excellent in resolution as well as in gradation reproducibility. The above image quality was not changed at all even when the image formation was repeated and the image at the first time was compared with those at the second time et seq. Further, the image characteristics were not lowered after the above process had been repeated for 50,000 times.

On the other hand, when the charging polarity was reversed, namely when corona charging was effected at ⊕6 KV, and imagewise exposure was carried out followed by cascade developing with ⊖ charged developer, no good image was obtained.

EXAMPLE 2

Using the same device as used in Example 1, a molybdenum substrate 502 was fixed according to the same procedures as in Example 1. Then, after confirming that all the valves in the system were closed, the main valve 531 was opened fully to evacuate once to about $5\times10^{-7}$ Torr (during this operation all the valves in the system were closed). Subsequently, the auxiliary valve 529, and then the outflow valves 524, 525, 526, 527 and 528 were opened to remove sufficiently the gases in the flowmeters 537, 538, 539, 540 and 541. Then, the outflow valves 524, 525, 526, 527 and 528, were closed.

Next, the valve 517 of the bomb 512 containing Ar gas (purity: 99.999%) were opened until the reading on the outlet pressure gage 535 was adjusted to 1 Kg/cm², and then the inflow valve 522 was opened, followed by gradual opening of the outflow valve 527 to permit Ar gas to flow into the deposition chamber 501. The outflow valve 527 was gradually opened until the indication on the Pirani gage 542 became $5\times10^{-4}$ Torr. After the flow amount was stabilized under this state, the main valve 531 was gradually closed to narrow the opening until the pressure in the chamber became $1\times10^{-2}$ Torr. After confirming that the flowmeter 540 was stabilized, with the shutter 508 being opened, and then the high frequency power source 543 was turned on to input an alternate power of 13.56 MHz, 100 W between the graphite target 505, silicon target 506 and the supporting member 503. A layer was formed while taking matching so as to continue stable discharging under these conditions. After discharging was continued under these conditions for one minute, a lower barrier layer with a thickness of 100 Å was formed. Then, the high frequency power source 543 was turned off for intermission of glow discharging. Subsequently, the outflow valve 522 was closed and the main valve 531 fully opened to discharge the gas in the deposition chamber 501 until it was evacuated to $5\times10^{-5}$ Torr. Then, the heater 504 was turned on, and its input voltage was changed while detecting the substrate temperature, until it was stabilized constantly at 250° C.

Further, the auxiliary valve 529, and then the outflow valve 527 and the inflow valve 522 were opened fully to effect degassing sufficiently in the flowmeter 540 to vacuum. Subsequently, following the same procedures as in Example 1, the photoconductive layer and the surface barrier layer were formed.

The thus prepared photoconductive member was placed in the same experimental charging-exposure device as used in Example 1, and image formation, developing and transfer were conducted in the same manner as in Example 1. As the result, there was obtained clear image with excellent resolution as well as good graduation reproducibility which was higher in density than that of Example 1. The repeating characteristics were also good. Further, similarly as in Example 1, image formation was attempted by reversing the charging polarity, but no good image was obtained.

EXAMPLE 3

Photoconductive members were prepared in the same manner as in Example 1 except that the thickness of the surface barrier layer was varied. These photoconductive members were employed to effect image formation by ⊖ polarity charging similarly as in Example 1, whereby the results as shown in Table 1 were obtained.

TABLE 1

| Layer thickness: | 30 Å | 100 Å | 1000 Å | 1μ | 5μ |
|---|---|---|---|---|---|
| Image quality: | Δ | | | Δ | X |

Excellent
Δ Good
X Practically slightly inferior

EXAMPLE 4

Using the same device as in Example 1, an photoconductive member having the layer structure as shown in FIG. 1 was prepared according to the following procedures.

A substrate of molybdenum 502 of 10 cm square having a thickness of 0.5 mm, whose surface had been cleaned, was fixed firmly on a supporting member 503 disposed at a predetermined position in a deposition chamber 501. Then, after confirming that all the valves in the system were closed, the main valve 531 was opened fully to evacuate the chamber once to $5\times10^{-7}$ Torr (during the operation all the valves in the system were closed) and the auxiliary valve 529 and the outflow valves 524, 525, 526, 527 and 528 were opened to remove sufficiently the gases in the flowmeters 537, 538, 539, 540 and 541. Then, the outflow valves 524, 525, 526, 527 and 528 were closed, whereupon the heater 504 was turned on to set the substrate temperature at 250° C. Subsequently, the valve 514 of the SiH₄(10)/H₂ gas bomb 509 and the valve 515 of the B₂H₆(100)/H₂ gas bomb 510 were opened until the pressures at the outlet pressure gages 532, 533 were adjusted to 1 Kg/cm², and then the inflow valves 519, 520 were gradually opened thereby to permit SiH₄(10)/H₂ gas and B₂H₆(100)/H₂ gas to flow into the flowmeters 537, 538, respectively, followed by gradual opening of the auxiliary valve 529. The inflow valves 519 and 521 were thereby adjusted so that the feed gas ratio of SiH₄(10)/H₂ to B₂H₆(100)/H₂ was 100:1. Then, opening of the auxiliary valve 529 was adjusted while reading carefully indication on the Pirani gage 542 until the inner pressure in the chamber 501 became $1\times10^{-2}$ Torr. After the inner pressure in the chamber 501 was stabilized, the main valve 531 was gradually closed to narrow the opening until the indication on the Pirani gage 542 became 0.5 Torr. After confirming that the gas inflow and the inner pressure were stabilized, with the shutter 508 being closed, the switch of the high frequency power source 543 was turned on to input a high frequency power of 13.56 MHz, between the supporting member 503 and the shutter 508 as electrode to generate glow discharge in the chamber 501 to provide an input power of 10 W. Glow discharge was continued for about 10 hours to form a photoconductive layer of a layer thickness of about 15 u.

Then, the high frequency power source 543 was turned off for intermission of glow discharging, and the valves 514, 515 and 519, 520, further 524, 525 were closed and the valve 531 was fully opened. After the chamber 501 was thoroughly evacuated to vacuum, the valve 529 was once closed and then the valve 518 of the bomb 513 containing BF$_3$ gas diluted with Ar to 5% [hereinafter referred to as BF$_3$(5)/Ar] to adjust the pressure at the outlet pressure gage 536 to 1 Kg/cm$^2$, followed by gradual opening of the inflow valve 523 to permit BF$_3$(5)/Ar gas to flow into the flowmeter 541. Then, the opening of the auxiliary valve 529 was adjusted to maintain the inner pressure in the chamber 501 at $1\times10^{-2}$ Torr. After the inner pressure in the chamber 501 was stabilized, the main valve 531 was gradually closed to narrow its opening until the indication on the Pirani gage 542 became 0.2 Torr. After confirming that the gas inflow and the inner pressure were stabilized, the switch of the high frequency power source 543 was turned on to input a high frequency power between the supporting member 503 and the shutter 508 as electrode, thereby generating glow discharge in the chamber 501 at an input power of 25 W. Thus, glow discharging was continued for about 6 minutes to form a surface barrier layer.

The thus formed surface barrier layer had a thickness of about 450 Å. Finally, the heater 504 was turned off, with the high frequency power source 543 being also turned off, and the outflow valve 528 and the inflow valve 523 were closed, with the main valve 531 fully opened, thereby to make the inner pressure in the chamber 501 to less than $10^{-5}$ Torr. Then, the main valve 531 was closed and after the substrate was cooled to 50° C., the inner pressure in the chamber 501 was made atmospheric through the leak valve 530, and the substrate having respective layers formed thereon was taken out.

The thus prepared photoconductive member was placed in an experimental device for charging and exposure to light, and corona charging was effected at $\ominus$6 KV, followed by imagewise exposure. As light source, a halogen lamp was employed at a light quantity of about 1 lux·sec.

Immediately thereafter, $\oplus$ charged developer (containing toner and carrier) was cascaded on the surface of the photoconductive member to obtain a good toner image on the photoconductive member. When the toner image on the member was transferred onto a transfer paper by corona charging at $\ominus$5.0 KV, there was obtained a clear image which was excellent in resolution as well as in gradation reproducibility. The above image quality was not changed at all even when the image formation was repeated and the image at the first time was compared with those at the second time et seq. Further, the image characteristics were not lowered after the above process had been repeated for 50,000 times.

On the other hand, when the charging polarity was reversed, namely when corona charging was effected at $\oplus$6 KV, and imagewise exposure was carried out followed by cascade developing with $\ominus$ charged developer, no good image was obtained.

EXAMPLE 5

Using the same device as used in Example 4, a molybdenum substrate 502 was fixed according to the same procedures as in Example 4. Then, after confirming that all the valves in the system were closed, the main valve 531 was opened fully to evacuate once to about $5\times10^{-7}$ Torr (during this operation all the valves in the system were closed). Subsequently, the auxiliary valve 529, and then the outflow valves 524, 525, 526, 527 and 528 were opened to remove sufficiently the gases in the flowmeters 537, 538, 539, 540 and 541. Then, the outflow valves 524, 525, 526, 527 and 528 were closed.

Next, the valve 517 of the bomb 512 containing Ar gas (purity: 99.999%) was opened until the reading on the outlet pressure gage 535 was adjusted to 1 Kg/cm$^2$, and then the inflow valve 522 was opened, followed by gradual opening of the outflow valve 527 to permit Ar gas to flow into the deposition chamber 501. The outflow valve 527 was gradually opened until the indication on the Pirani gage 542 became $5\times10^{-4}$ Torr. After the flow amount was stabilized under this state, the main valve 531 was gradually closed to narrow the opening until the pressure in the chamber became $1\times10^{-2}$ Torr. After confirming that the flowmeter 540 was stabilized, with the shutter 508 being opened, and then the high frequency power source 543 was turned on to input an alternate power of 13.56 MHz, 100 W between the target (graphite target 505, silicon target 506) and the supporting member 503. A layer was formed while taking matching so as to continue stable discharging under these conditions. After discharging was continued under these conditions for one minute, a lower barrier layer with a thickness of 100 Å was formed. Then, the high frequency power source 543 was turned off for intermission of glow discharging. Subsequently, the outflow valve 522 was closed and the main valve 531 fully opened to discharge the gas in the deposition chamber 501 until it was evacuated to $5\times10^{-5}$ Torr. Then, the input voltage at the heater 504 was changed and stabilized while detecting the substrate temperature, until it was stabilized constantly at 250° C.

Further, the auxiliary valve 529, and then the outflow valve 527 and the inflow valve 522 were opened fully to effect degassing sufficiently in the flowmeter 540 to vacuum. Subsequently, following the same procedures as in Example 4, the photoconductive layer and the surface barrier layer were formed.

The thus prepared photoconductive member was placed in the same experimental charging-exposure device as used in Example 4, and image formation, developing and transfer were conducted in the same manner as in Example 4. As the result, there was obtained a clear image with excellent resolution as well as good gradation reproducibility which was higher in density than that of Example 4. The characteristics of repeated copying were also good. Further, similarly as in Example 4, image formation was attempted by reversing the charging polarity, but no good image was obtained.

EXAMPLE 6

Photoconductive members were prepared in the same manner as in Example 4 except that the thickness of the surface barrier layer was varied. These photoconductive members were employed to effect image formation by $\ominus$ polarity charging similarly as in Example 4, whereby the results as shown in Table 2 were obtained.

TABLE 2

| Layer thickness: | 30 Å | 100 Å | 1000 Å | 1μ | 3μ |
| --- | --- | --- | --- | --- | --- |
| Image quality: | Δ |  |  | Δ | X |

Excellent
Δ Good
X Practically slightly inferior

EXAMPLE 7

The $B_2H_6(5)/H_2$ gas bomb 511 was previously replaced by a gas bomb containing $BF_3$ gas diluted with Ar to 5 vol. % [hereinafter referred to as $BF_3(5)/Ar$], and the $BF_3(5)/Ar$ gas bomb 513 by a gas bomb containing $B_2H_6$ gas diluted with Ar to 5 vol. % [hereinafter referred to as $B_2H_6(5)/Ar$ gas]. Using the device as shown in FIG. 5, a photoconductive member having the layer structure as shown in FIG. 1 was prepared according to the following procedures.

A substrate of molybdenum 502 of 10 cm square having a thickness of 0.5 mm, whose surface had been cleaned, was fixed firmly on a supporting member 503 disposed at a predetermined position in a deposition chamber 501.

Then, after confirming that all the valves in the system were closed, the main valve 531 was opened fully to evacuate the chamber once to $5 \times 10^{-7}$ Torr (during the operation all the valves in the system were closed) and the auxiliary valve 529 and the outflow valves 524, 525, 526, 527 and 528 were opened to remove sufficiently the gases in the flowmeters 537, 538, 539, 540 and 541. Then, the outflow valves 524, 525, 526, 527 and 528 were closed, whereupon the heater 504 was turned on to set the substrate temperature at 250° C.

Subsequently, the valve 514 of the $SiH_4(10)/H_2$ gas bomb 509 and the valve 515 of the $B_2H_6(100)/H_2$ gas bomb 510 were opened until the pressures at the outlet pressure gages 532, 533 were adjusted to 1 Kg/cm², and then the inflow valves 519, 520 were gradually opened thereby to permit $SiH_4(10)/H_2$ gas and $B_2H_6(100)/H_2$ gas to flow into the flowmeters 537, 538, respectively, followed by gradual opening of the auxiliary valve 529. The inflow valves 519 and 520 were thereby adjusted so that the feed gas ratio of $SiH_4(10)/H_2$ to $B_2H_6(100)/H_2$ was 100:1. Then, opening of the auxiliary valve 529 was adjusted while reading carefully indication on the Pirani gage 542 until the inner pressure in the chamber 501 became $1 \times 10^{-2}$ Torr. After the inner pressure in the chamber 501 was stabilized, the main valve 531 was gradually closed to narrow the opening until the indication on the Pirani gage 542 became 0.5 Torr. After confirming that the gas inflow and the inner pressure were stabilized, with the shutter 508 being closed, the switch of the high frequency power source 543 was turned on to input a high frequency power of 13.56 MHz, between the supporting member 503 and the shutter 508 as electrode to generate glow discharge in the chamber 501 to provide an input power of 10 W. Glow discharging was continued for about 10 hours to form a photoconductive layer of a layer thickness of about 15μ.

Then, the high frequency power source 543 was turned off for intermission of glow discharging, and the valves 514, 515 and 519, 520, further 524, 525 were closed and the valve 531 was fully opened. After the chamber 501 was thoroughly evacuated to vacuum, the valve 529 was once closed.

Then, the valve 516 of the $BF_3(5)/Ar$ gas bomb 511 and the valve 518 of the $B_2H_6(5)/Ar$ gas bomb 513 were gradually opened to adjust the pressures at the outlet pressure gages 534 and 536 to 1 Kg/cm², followed by gradual opening of the inflow valves 521, 523 to permit $BF_3(5)/Ar$ gas and $B_2H_6(5)/Ar$ gas to flow into the flowmeters 539, 541, respectively. Subsequently, the outflow valves 526, 528 were gradually opened, followed by gradual opening of the auxiliary valve 529. The inflow valves 521, 523 were thereby controlled so that the gas feeding ratio of $BF_3(5)/Ar$ gas to $B_2H_6(5)/Ar$ gas was 1:1.

Then, the opening of the auxiliary valve 529 was adjusted to maintain the inner pressure in the chamber 501 at $1 \times 10^{-2}$ Torr. After the inner pressure in the chamber 501 was stabilized, the main valve 531 was gradually closed to narrow its opening until the indication on the Pirani gage 542 became 0.2 Torr. After confirming that the gas inflow and the pressure were stabilized, the switch of the high frequency power source 543 was turned on to input a high frequency power between the supporting member 503 and the shutter 508 as electrode, thereby generating glow discharge in the chamber 501 at an input power of 25 W. Thus, glow discharging was continued for about 5 minutes to form a surface barrier layer.

The thus formed surface barrier layer had a thickness of about 400 Å.

Finally, the heater 504 was turned off, with the high frequency power source 543 being also turned off, and the outflow valve 526 and the inflow valve 521 were closed, with the main valve 531 fully opened, thereby to make the inner pressure in the chamber 501 to less than $10^{-5}$ Torr. Then, the main valve 531 was closed and after the substrate was cooled to 50° C., the inner pressure in the chamber 501 was made atmospheric through the leak valve 530, and the substrate having respective layers formed thereon was taken out.

The thus prepared photoconductive member was placed in an experimental device for charging and exposure to light, and corona charging was effected at $\ominus 6$ KV, followed by imagewise exposure. As light source, a halogen lamp was employed at a light quantity of about 1 lux·sec.

Immediately thereafter, $\oplus$ charged developer (containing toner and carrier) was cascaded on the surface of the photoconductive member to obtain a good toner image on the photoconductive member. When the toner image on the member was transferred onto a transfer paper by corona charging at $\ominus 5.0$ KV, there was obtained a clear image which was excellent in resolution as well as in gradation reproducibility. The above image quality was not changed at all even when the image formation was repeated and the image at the first time was compared with those at the second time et seq. Further the image characteristics were not lowered even after the above process had been repeated for 50,000 times.

On the other hand, when the charging polarity was reversed, namely when corona charging was effected at $\oplus 6$ KV and imagewise exposure was conducted followed by cascade developing with $\ominus$ charged developer, no good image was obtained.

EXAMPLE 8

Using the same device as used in Example 7, a molybdenum substrate 502 was fixed according to the same procedures as in Example 7.

Then, after confirming that all the valves in the system were closed, the main valve 531 was opened fully to evacuate once to about $5 \times 10^{-7}$ Torr (during this operation all the valves in the system were closed). Subsequently, the auxiliary valve 529, and then the outflow valves 524, 525, 526, 527 and 528 were opened to remove sufficiently the gases in the flowmeters 537, 538, 539, 540 and 541. Then, the outflow valves 524, 525, 526, 527 and 528, were closed.

Next, the valve 517 of the bomb 512 containing Ar gas (purity: 99.999%) were opened until the reading on the outlet pressure gage 535, was adjusted to 1 Kg/cm$^2$, and then the inflow valve 522 was opened to permit Ar gas to flow into the deposition chamber 501. The outflow valve 527 was gradually opened until the indication on the Pirani gage 542 became $5 \times 10^{-4}$ Torr. After the flow amount was stabilized under this state, the main valve 531 was gradually closed to narrow the opening until the pressure in the chamber became $1 \times 10^{-2}$ Torr. After confirming that the flowmeter 540 was stabilized, with the shutter 508 being opened, and then the high frequency power source 543 was turned on to input an alternate power of 13.56 MHz, 100 W between the target (graphite target 505, silicon target 506) and the supporting member 503. A layer was formed while taking matching so as to continue stable discharging under these conditions. After discharging was continued under these conditions for one minute, a lower barrier layer with a thickness of 100 Å was formed. Then, the high frequency power source 543 was turned off for intermission of glow discharging. Subsequently, the outflow valve 522 was closed and the main valve 531 fully opened to discharge the gas in the deposition chamber 501 until it was evacuated to $5 \times 10^{-5}$ Torr. Then, the input voltage at the heater 504 was changed and stabilized while detecting the substrate temperature, until it was stabilized constantly at 250° C.

Further the auxiliary valve 529, and then the outflow valve 527 and the inflow valve 522 were opened fully to effect degassing sufficiently in the flowmeter 540 to vacuum.

Subsequently, following the same procedures as in Example 7, the photoconductive layer and the surface barrier layer were formed.

The thus prepared photoconductive member was placed in the same experimental charging-exposure device as used in Example 7, and image formation, developing and transfer were conducted in the same manner as in Example 7. As the result, there was obtained a clear image with excellent resolution as well as good gradation reproducibility which was higher in density than that of Example 7. The characteristics of repeated copying were also good. Further, similarly as in Example 7, image formation was attempted by reversing the charging polarity, but no good image was obtained.

EXAMPLE 9

Photoconductive members were prepared in the same manner as in Example 7 except that the thickness of the surface barrier layer was varied. These photoconductive members were employed to effect image formation by ⊖ polarity charging similarly as in Example 7, whereby the results as shown in Table 3 were obtained.

TABLE 3

| Layer thickness: | 30 Å | 120 Å | 1000 Å | 1μ | 4μ |
|---|---|---|---|---|---|
| Image quality: | Δ | | | Δ | X |

Excellent
Δ Good
X Practically slightly inferior

EXAMPLE 10

Using a device as shown in FIG. 5, a photoconductive member having the layer structure as shown in FIG. 3 following procedures.

A substrate of molybdenum 502 of 10 cm square having a thickness of 0.5 mm, whose surface had been cleaned, was fixed firmly on a supporting member 503 disposed at a predetermined position in a deposition chamber 501. The shutter 508 was closed. The substrate 502 was heated by a heater 504 within the supporting member 503 with a precision of ±0.5° C. Then, after confirming that all the valves in the system were closed, the main valve 531 was opened fully to evacuate the chamber once to $5 \times 10^{-7}$ Torr (during the operation all the valves in the system were closed) and the auxiliary valve 529 and the outflow valves 524, 525, 526, 527, were opened to remove sufficiently the gases in the flowmeters 537, 538, 539, 540. Then, the outflow valves 524, 525, 526, 527, were closed, whereupon the heater 504 was turned on to set the substrate temperature at 250° C.

Subsequently, the valve 516 of the B$_2$H$_6$(5)/H$_2$ gas bomb 511 was opened until the pressure at the outlet pressure gage 534 was adjusted to 1 Kg/cm$^2$, and then the inflow valve 521 was gradually opened thereby to permit B$_2$H$_6$(5)/H$_2$ gas to flow into the flowmeter 539. Then, the inflow valve 526 was gradually opened and the opening of the auxiliary valve 529 was adjusted to maintain the inner pressure in the chamber 501 at $1 \times 10^{-2}$ Torr. After the inner pressure in the chamber 501 was stabilized, the main valve 531 was gradually closed to narrow the opening until the indication on the Pirani gage 542 became 0.2 Torr. After confirming that the gas inflow and the inner pressure were stabilized, with the shutter 508 being closed, the switch of the high frequency power source 543 was turned on to input a high frequency power between the supporting member 503 and the shutter 508 as electrode to generate glow discharge in the chamber 501 at an input power of 20 W. Glow discharge was continued for about 6 minutes to form an intermediate layer.

The thus prepared intermediate layer had a thickness of about 400 Å. Then, the high frequency power source 543 was turned off for intermission of glow discharging, and the valves 516, 521, further 526, were closed and the valve 531 was fully opened. After the chamber 501 was thoroughly evacuated to vacuum, the valve 529 was once closed, and then the valve 514 of the SiH$_4$(10)/H$_2$ gas bomb 509 and the valve 515 of the B$_2$H$_6$(100)/H$_2$ gas bomb 510 were opened to adjust the pressures at the outlet pressure gages 532, 533, to 1 Kg/cm$^2$, followed by gradual opening of the inflow valves 519, 520 to permit SiH$_4$(10)/H$_2$ gas and B$_2$H$_6$(100)/H$_2$ gas to flow into the flowmeters 537, 538, respectively. Subsequently, the outflow valves 524, 525 were gradually opened and then the auxiliary valve 529 was gradually opened. The inflow valves 519, 520 were thereby adjusted so that the gas feed ratio of SiH$_4$(10)/H$_2$ gas to B$_2$H$_6$(100)/H$_2$ gas was 100:1. Then, the opening of the auxiliary valve 529 was adjusted while carefully reading the Pirani gage 542 until the inner pressure in the chamber 501 became $1 \times 10^{-2}$ Torr. After the inner pressure in the chamber 501 was stabilized, the main valve 531 was gradually closed to narrow its opening until the indication on the Pirani gage 542 became 0.5 Torr. After confirming that the gas inflow and the inner pressure were stabilized, the switch of the high frequency power source 543 was turned on to input a high frequency 508 power of 13.56 MHz between the supporting member 503 and the shutter 508 as electrode, thereby generating glow discharge in the chamber 501 at an input power of 10 W. Thus glow discharging was continued for about 10 hours to form a photoconductive layer with a thickness of about 15μ.

Finally, the heater 504 was turned off, with the high frequency power source 543 being also turned off, and the outflow valves 524, 525 and the inflow valves 519, 520 were closed, with the main valve 531 fully opened, thereby to make the inner pressure in the chamber 501 to less than $10^{-5}$ Torr. Then, the main valve 531 was closed and after the substrate was cooled to 50° C., the inner pressure in the chamber 501 was made atmospheric through the leak valve 530, and the substrate having respective layers formed thereon was taken out.

The thus prepared photoconductive member was placed in an experimental device for charging and exposure to light, and corona charging was effected at ⊕6 KV, followed by imagewise exposure. As light source, a halogen lamp was employed at a light quantity of about 1.2 lux·sec.

Immediately thereafter ⊖ charged developer (containing toner and carrier) was cascaded on the surface of the photoconductive member to obtain a good toner image on the photoconductive member. When the toner image on the member was transferred onto a transfer paper by corona charging at ⊕5.0 KV, there was obtained a clear image which was excellent in resolution as well as in gradation reproducibility. The above image quality was not changed at all even when the image formation was repeated and the image at the first time was compared with those at the second time et seq. Further, the image characteristics were not lowered even after the above process had been repeated for 50,000 times.

On the other hand, when the charging polarity was reversed, namely when corona charging was effected at ⊖6 KV, and imagewise exposure was conducted followed by cascade developing with ⊕ charged developer, no good image was obtained.

EXAMPLE 11

According to the same conditions and procedures as in Example 10, an intermediate layer and a photoconductive layer were formed on a molybdenum substrate.

Then, the heater 504 and the high frequency power source 543 were turned off and, after the substrate was cooled to 50° C., the outflow valves 524, 525 and inflow valves 519, 520 were closed, with full opening of the main valve 531 to degass sufficiently the chamber 501. Next, the valve 517 of the bomb 512 containing Ar gas (purity: 99.999%) was opened until the reading on the outlet pressure gage 535 was adjusted to 1 Kg/cm², and then the inflow valve 522 was opened, followed by gradual opening of the outflow valve 527 to permit Ar gas to flow into the deposition chamber 501. The outflow valve 527 was gradually opened until the indication on the Pirani gage 542 became $5 \times 10^{-4}$ Torr. After the flow amount was stabilized under this state, the main valve 531 was gradually closed to narrow the opening until the pressure in the chamber became $1 \times 10^{-2}$ Torr. After confirming that the flowmeter 540 was stabilized, with the shutter 508 being opened, and then the high frequency power source 543 was turned on to input an alternate power of 13.56 MHz, 100 W between the target (graphite target 505, silicon target 506) and the supporting member 503. A layer was formed while taking matching so as to continue stable discharging under these conditions. After discharging was continued under these conditions for one minute, surface barrier layer with a thickness of 100 Å was formed. Then, the high frequency power source 543 was turned off for intermission of glow discharging. Subsequently, the outflow valve 527 and inflow valve 522 were closed, and the main valve 531 was fully opened to discharge the gas in the deposition chamber 501 until it was evacuated to $10^{-5}$ Torr or below. Then, the main valve 531 was closed and the chamber 501 was made atmospheric through the leak valve 530, and the substrate having respective layers formed thereon was taken out.

The thus prepared photoconductive member was placed in the same experimental charging-exposure device as used in Example 10, and the image formation, developing and transfer were conducted in the same manner as in Example 10. As the result, there was obtained a clear image with excellent resolution as well as good gradation reproducibility which was high in density than that of Example 10. The characteristics of repeated copying were also good. Further, similarly as in Example 10 image formation was attempted by reversing the charging polarity, but no good image was obtained.

EXAMPLE 12

Photoconductive members were prepared in the same manner as in Example 10 except that the thickness of the intermediate layer was varied. These photoconductive members were employed to effect image formation by ⊕ polarity charging similarly as in Example 10, whereby the results as shown in Table 4 were obtained.

TABLE 1

| Layer thickness: | 30 Å | 100 Å | 1000 Å | 1μ | 5μ |
|---|---|---|---|---|---|
| Image quality: | Δ | | | Δ | X |

Excellent
Δ Good
X Practically slightly inferior

EXAMPLE 13

Using a device as shown in FIG. 5, a photoconductive member having the layer structure as shown in FIG. 3 was prepared according to the following procedures.

A substrate of molybdenum 502 of 10 cm square having a thickness of 0.5 mm, whose surface had been cleaned, was fixed firmly on a supporting member 503 disposed at a predetermined position in a deposition chamber 501.

Then, after confirming that all the valves in the system were closed, the main valve 531 was opened fully to evacuate the chamber once to $5 \times 10^{-7}$ Torr (during the operation all the valves in the system were closed) and the auxiliary valve 529 and the outflow valves 524, 525, 526, 527, were opened to remove sufficiently the gases in the flowmeters 537, 538, 539, 540. Then, the outflow valves 524, 525, 526, 527, were closed, whereupon the heater 504 was turned on to set the substrate temperature at 250° C.

Subsequently, the valve 516 of the BF₃(5)/Ar gas bomb 511 was opened until the pressure at the outlet pressure gage 534 was adjusted to 1 Kg/cm², and then the inflow valve 521 was gradually opened thereby to permit BF$_3$(5)/Ar gas to flow into the flowmeter 539. Then, the inflow valve 526 was gradually opened and the opening of the auxiliary valve 529 was adjusted to maintain the inner pressure in the chamber 501 at $1\times10^{-2}$ Torr. After the inner pressure in the chamber 501 was stabilized, the main valve 531 was gradually closed to narrow the opening until the indication on the Pirani gage 542 became 0.2 Torr. After confirming that the gas inflow and the inner pressure were stabilized, with the shutter 508 being closed, the switch of the high frequency power source 543 was turned on to input a high frequency power, between the supporting member 503 and the shutter 508 as electrode to generate glow discharge in the chamber 501 at an input power of 25 W. Glow discharge was continued for about 6 minutes to form an intermediate layer.

The thus prepared intermediate layer had a thickness of about 450 Å. Then, the high frequency power source 543 was turned off for intermission of glow discharging, and the valves 516, 521, further 526 were closed and the valve 531 was fully opened. After the chamber 501 was thoroughly evacuated to vacuum, the valve 529 was once closed and then the valve 514 of the SiH$_4$(10)/H$_2$ gas bomb 509 and the valve 515 of the B$_2$H$_6$(100)/H$_2$ gas bomb 510 opened to adjust the pressures at the outlet pressure gages 532, 533 to 1 Kg/cm$^2$, followed by gradual opening of the inflow valves 519, 520 to permit SiH$_4$(10)/H$_2$ gas and B$_2$H$_6$(100)/H$_2$ gas to flow into the flowmeters 537, 538, respectively. Subsequently, the outflow valves 524, 525 were gradually opened and then the auxiliary valve 529 was gradually opened. The inflow valves were thereby adjusted so that the gas feed ratio of SiH$_4$(10)/H$_2$ gas to B$_2$H$_6$(100)/H$_2$ gas was 100:1. Then, the opening of the auxiliary valve 529 was adjusted while carefully reading the Pirani gage 542 until the inner pressure in the chamber 501 became $1\times10^{-2}$ Torr. After the inner pressure in the chamber 501 was stabilized, the main valve 531 was gradually closed to narrow its opening until the indication on the Pirani gage 542 became 0.2 Torr. After confirming that the gas inflow and the inner pressure were stabilized, the switch of the high frequency power source 543 was turned on to input a high frequency power of 13.56 MHz between the supporting member 503 and the shutter 508 as electrode, thereby generating glow discharge in the chamber 501 at an input power of 10 W. Thus, glow discharging was continued for about 10 hours to form a photoconductive layer with a thickness of about 15$\mu$.

Finally, the heater 504 was turned off, with the high frequency power source 543 being also turned off, and the outflow valves 524, 525 and the inflow valves 519, 520 were closed, with the main valve 531 fully opened, thereby to make the inner pressure in the chamber 501 to less than $10^{-5}$ Torr. Then, the main valve 531 was closed, and after the substrate was cooled to 50° C., the inner pressure in the chamber 501 was made atmospheric through the leak valve 530, and the substrate having respective layers formed thereon was taken out.

The thus prepared photoconductive member was placed in an experimental device for charging and exposure to light, and corona charging was effected at $\oplus$6 KV, followed by imagewise exposure. As light source, a halogen lamp was employed at a light quantity of about 1.2 lux·sec.

Immediately thereafter, $\ominus$ charged developer (containing toner and carrier) was cascaded on the surface of the photoconductive member to obtain a good toner image on the photoconductive member. When the toner image on the member was transferred onto a transfer paper by corona charging at $\oplus$5.0 KV, there was obtained a clear image which was excellent in resolution as well as in gradation reproducibility. The above image quality was not changed at all even when the image formation was repeated and the image at the first time was compared with those at the second time et seq. Further, the image characteristics were not lowered even after the above process had been repeated for 50,000 times.

On the other hand, when the charging polarity was reversed, namely when corona charging was effected at $\ominus$6 KV and imagewise exposure was conducted followed by cascade developing with $\oplus$ charged developer, no good image was obtained.

EXAMPLE 14

According to the same conditions and procedures as in Example 13, an intermediate layer and a photoconductive layer were formed on a molybdenum substrate.

Then, the heater 504 and the high frequency power source 543 were turned off and, after the substrate was cooled to 50° C., the outflow valves 524, 525 and inflow valves 519, 520 were closed, with full opening of the main valve 531 to degass sufficiently the chamber 501. Next, the valve 517 of the bomb 512 containing Ar gas (purity: 99.999%) was opened until the reading on the outlet pressure gage 535 was adjusted to 1 Kg/cm$_2$, and then the inflow valve 522 was opened, followed by gradual opening of the outflow valve 527 to permit Ar gas to flow into the deposition chamber 501. The outflow valve 527 was gradually opened until the indication on the Pirani gage 542 became $5\times10^{-4}$ Torr. After the flow amount was stabilized under this state, the main valve 531 was gradually closed to narrow the opening until the pressure in the chamber became $1\times10^{-2}$ Torr. After confirming that the flowmeter 540 was stabilized, with the shutter 508 being opened, and then the high frequency power source 543 was turned on to input an alternate power of 13.56 MHz, 100 W between the target (graphite target 505, silicon target 506) and the supporting member 503. A layer was formed while taking matching so as to continue stable discharging under these conditions. After discharging was continued under these conditions for one minute, a surface barrier layer with a thickness of 100 Å was formed. Then, the high frequency power source 543 was turned off for intermission of glow discharging. Subsequently, the outflow valve 527 and inflow valve 522 were closed and the main valve 531 fully opened to discharge the gas in the deposition chamber 501 until it was evacuated to $10^{-5}$ Torr. Then, the main valve 531 was closed and the chamber 501 was made atmospheric through the leak valve 530, and the substrate having respective layers formed thereon was taken out.

The thus prepared photoconductive member was placed in the same experimental charging-exposure device as used in Example 13, and image formation, developing and transfer were conducted in the same manner as in Example 13. As the result, there was obtained a clear image with excellent resolution as well as good gradation reproducibility which was higher in density than that of Example 13. The characteristics of repeated copying were also good. Further, similarly as in Example 13 image formation was attempted by reversing the charging polarity, but no good image was obtained.

EXAMPLE 15

Photoconductive members were prepared in the same manner as in Example 13 except that the thickness of the intermediate layer was varied. These photoconductive members were employed to effect image formation by ⊕ polarity charging similarly as in Example 13, whereby the results as shown in Table 5 were obtained.

TABLE 2

| Layer thickness: | 30 Å | 100 Å | 1000 Å | 1μ | 3μ |
|---|---|---|---|---|---|
| Image quality: | | Δ | | Δ | X |

Excellent
Δ Good
X Practically slightly inferior

EXAMPLE 16

Using a device as shown in FIG. 5, a photoconductive member having the layer structure as shown in FIG. 3 was prepared according to the following procedures.

A substrate of molybdenum 502 of 10 cm square having a thickness of 0.5 mm, whose surface had been cleaned, was fixed firmly on a supporting member 503 disposed at a predetermined position in a deposition chamber 501.

Then, after confirming that all the valves in the system were closed, the main valve 531 was opened fully to evacuate the chamber once to $5 \times 10^{-7}$ Torr (during the operation all the valves in the system were closed) and the auxiliary valve 529 and the outflow valves 524, 525, 526, 527, 528 were opened to remove sufficiently the gases in the flowmeters 537, 538, 539, 540, 541. Then, the outflow valves 524, 525, 526, 527, 528 were closed, whereupon the heater 504 was turned on to set the substrate temperature at 250° C.

Subsequently, the valve 516 of the BF$_3$(5)/Ar gas bomb 511 and the valve 518 of the B$_2$H$_6$(5)/Ar gas bomb 513 were opened until the pressure at the outlet pressure gages 534, 536 were adjusted to 1 Kg/cm$^2$, and then the inflow valves 521, 523 were gradually opened thereby to permit BF$_3$(5)/Ar gas and B$_2$H$_6$(5)/Ar gas to flow into the flowmeters 539, 541, respectively. Then, the outflow valves 526, 528 were gradually opened, followed by gradual opening of the auxiliary valve 529. The inflow valves 521, 523 were thereby adjusted so that the gas feed ratio of BF$_3$(5)/Ar gas to B$_2$H$_6$(5)/Ar gas was 1:1. Subsequently, the opening of the auxiliary valve 529 was adjusted to maintain the inner pressure in the chamber 501 at $1 \times 10^{-2}$ Torr. After the inner pressure in the chamber 501 was stabilized, the main valve 531 was gradually closed to narrow the opening until the indication on the Pirani gage 542 became 0.2 Torr. After confirming that the gas inflow and the inner pressure were stabilized, the switch of the high frequency power source 543 was turned on to input a high frequency power between the supporting member 503 and the shutter 508 as electrode to generate glow discharge in the chamber 501 at an intput power of 25 W. Glow discharge was continued for about 5 mintues to form an intermediate layer.

The thus prepared intermediate layer had a thickness of about 400 Å. Then, the high frequency power source 543 was turned off for intermission of glow discharging, and the valves 516, 518 and 521, 523, further 526, 528 were closed and the valve 531 was fully opened. After the chamber 501 was thoroughly evacuated to vacuum, the valve 529 was once closed and then the valve 514 of the SiH$_4$(10)/H$_2$ gas bomb 509 and the valve 515 of the B$_2$H$_6$(100)/H$_2$ gas bomb 510 opened to adjust the pressures at the outlet pressure gages 532, 533, to 1 Kg/cm$^2$, followed by gradual opening of the inflow valves 519, 520 to permit SiH$_4$(10)/H$_2$ gas and B$_2$H$_6$(100)/H$_2$ gas to flow into the flowmeters 537, 538, respectively. Subsequently, the outflow valves 524, 525 were gradually opened and then the auxiliary valve 529 was gradually opened. The inflow valves 519, 520 were thereby adjusted so that the gas feed ratio of SiH$_4$(10)/H$_2$ gas to B$_2$H$_6$(100)/H$_2$ gas was 100:1. Then, the opening of the auxiliary valve 529 was adjusted while carefully reading the Pirani gage 542 until the inner pressure in the chamber 501 became $1 \times 10^{-2}$ Torr. After the inner pressure in the chamber 501 was stabilized, the main valve 531 was gradually closed to narrow its opening until the indication on the Pirani gage 542 became 0.2 Torr. After confirming that the gas inflow and the inner pressure were stabilized, the switch of the high frequency power source 543 was turned on, with the shutter 508 being closed, to input a high frequency power of 13.56 MHz between the supporting member 503 and the shutter 508 as electrode, thereby generating glow discharge in the chamber 501 at an input power of 10 W. Thus glow discharging was continued for about 10 hours to form a photoconductive layer with a thickness of about 15μ.

Finally, the heater 504 was turned off, with the high frequency power source 543 being also turned off, and the outflow valves 524, 525 and the inflow valves 519, 520 were closed, with the main valve 531 fully opened, thereby to make the inner pressure in the chamber 501 to less than $10^{-5}$ Torr. Then, the main valve 531 was closed and after the substrate was cooled to 50° C., the inner pressure in the chamber 501 was made atmospheric through the leak valve 530, and the substrate having respective layers formed thereon was taken out.

The thus prepared photoconductive member was placed in an experimental device for charging and exposure to light, and corona charging was effected at b ⊕6 KV, followed by imagewise exposure. As light source, a halogen lamp was employed at a light quantity of about 1.2 lux·sec.

Immediately thereafter, ⊖ charged developer (containing toner and carrier) was cascaded on the surface of the photoconductive member to obtain a good toner image on the photoconductive member. When the toner image on the member was transferred onto a transfer paper by corona charging at ⊕5.0 KV, there was obtained a clear image which was excellent in resolution as well as in gradation reproducibility. The above image quality was not changed at all even when the image formation was repeated and the image at the first time was compared with those at the second time et seq. Further, the image characteristics were not lowered even after the above process had been repeated for 50,000 times.

On the other hand, when the charging polarity was reversed, namely when corona charging was effected at ⊖6 KV and imagewise exposure followed by cascade developing with ⊕ charged developer, no good image was obtained.

EXAMPLE 17

According to the same conditions and procesures as in Example 16, an intermediate layer and a photoconductive layer were formed on a molybdenum substrate.

Then, the heater 504 and the high frequency power source 543 were turned off and, after the substrate was cooled to 50° C., the outflow valves 524, 525 and inflow valves 519, 520 were closed, with full opening of the main valve 531 to degass sufficiently the chamber 501. Next, the valve 517 of the bomb 512 containing Ar gas (purity: 99.999%) was opened until the reading on the outlet pressure gage 535 was adjusted to 1 Kg/cm², and then the inflow valve 522 was opened, followed by gradual opening of the outflow valve 527 to permit Ar gas to flow into the deposition chamber 501. The outflow valve 527 was gradually opened until the indication on the Pirani gage 542 became $5 \times 10^{-4}$ Torr. After the flow amount was stabilized under this state, the main valve 531 was gradually closed to narrow the opening until the pressure in the chamber became $1 \times 10^{-2}$ Torr. After confirming that the flowmeter 540 was stabilized, with the shutter 508 being opened, and then the high frequency power source 543 was turned on to input an alternate power of 13.56 MHz, 100 W between the target (graphite target 505, silicon target 506) and the supporting member 503. A layer was formed while taking matching so as to continue stable discharging under these conditions. After discharging was continued under these conditions for one minute, a surface barrier layer with a thickness of 100 Å was formed. Then, the high frequency power source 543 was turned off for intermission of glow discharging. Subsequently, the outflow valve 522 was closed and the main valve 531 fully opened to discharge the gas in the deposition chamber 501 until it was evacuated to less than $10^{-5}$ Torr. Then, the main valve 531 was closed and the chamber 501 was made atmospheric through the leak valve 530, and the substrate having respective layers formed thereon was taken out.

The thus prepared photoconductive member was placed in the same experimental charging-exposure device as used in Example 16, and image formation, developing and transfer were conducted in the same manner as in Example 16. As the result, there was obtained a clear image with excellent resolution as well as good gradation reproducibility which was higher in density than that of Example 16. The characteristics of repeated copying were also good. Further, similarly as in Example 16 image formation was attempted by reversing the charging polarity, but no good image was obtained.

EXAMPLE 18

Photoconductive members were prepared in the same manner as in Example 16 except that the thickness of the intermediate layer was varied. These photoconductive members were employed to effect image formation by ⊕ polarity charging similarly as in Example 16, whereby the results as shown in Table 6 were obtained.

TABLE 3

| Layer thickness: | 30 Å | 120 Å | 1000 Å | 1μ | 4μ |
|---|---|---|---|---|---|
| Image quality: | Δ |  |  | Δ | X |

Excellent
Δ Good
X Practically slightly inferior

What we claim is:

1. A photoconductive member comprising a support, a photoconductive layer comprising an amorphous material comprising a matrix of silicon atoms containing at least one of hydrogen atoms and halogen atoms, a barrier layer comprising an amorphous material represented by a—[$Si_\gamma(C,N,O)_{1-\gamma}$]$(H,X)_{1-\delta}$, where $0<\gamma<1$, and $0<\delta<1$ existing between said support and said photoconductive layer having the function to substantially prevent injection of charges from the side of said support into said photoconductive layer, and a layer provided on the upper surface of said photoconductive layer and comprising an amorphous material containing boron, wherein the amorphous material containing boron is a member selected from the group consisting of the amorphous materials (1) and (2) wherein $B_yX_{1-y}(0<y<1)$ is (1) and $B(H_\beta X_{1-\beta})_{1-\alpha}(0<\alpha,\beta<1)$ is (2); and wherein B is boron atom, H is hydrogen atom and X is halogen atom.

2. A photoconductive member comprising a support, a photoconductive layer comprising an amorphous material comprising a matrix of silicon atoms containing at least one of hydrogen atoms and halogen atoms, a layer existing between said support and said photoconductive member and comprising an amorphous material containing boron, wherein the amorphous material containing boron is a member selected from the group consisting of the amorphous materials (1) and (2) wherein $B_yX_{1-y}(0<y<1)$ is (1) and $B_\alpha(H_{62} X_{1-\beta})_{1-\alpha}(0<\alpha,\beta<1)$ is (2); and wherein B is boron atom, H is hydrogen atoms and X is halogen atom, and a barrier layer comprising an amorphous material represented by a—[$Si_\gamma(C,N,O)_{1-\gamma}$]$\delta(H,X)_{1-67}$, where $0<\gamma<1$, and $0<\delta<1$ provided on the upper surface of said photconductive layer.

3. A photoconductive member according to claims 1, or 2 wherein the barrier layer has a thickness of 30 Angstroms to 1 micron.

4. A photoconductive layer according to claim 1 wherein the barrier layer has a thickness of 30 Angstroms to 1 micron.

5. The photoconductive member according to one of claims 1, or 2 wherein the photoconductive layer contains 1–40 atomic percent of hydrogen.

6. The photoconductive member according to one of claims 1, or 2, wherein the photoconductive layer contains 1–40 atomic percent of halogen.

7. The photoconductive member according to one of claims 1, or 2, wherein the photoconductive layer contains a total of 1–40 atomic percent of hydrogen and halogen.

8. The photoconductive member according to any one of claims 1, or 2 wherein the photoconductive layer is from 3 to 100 microns in thickness.

9. The photoconductive member of claim 1 wherein the photoconductive layer contains an impurity.

10. The photoconductive member of claim 9 in which the content of impurity is $5 \times 10^{-3}$ atomic percent or less.

11. The photoconductive member of claim 2 wherein the photoconductive layer contains an impurity.

12. The photoconductive member of claim 11 in which the content of impurity is $5 \times 10^{-3}$ atomic percent or less.

13. The photographic member according to one of claims 1, or 2 wherein the layer containing amorphous boron material contains 1 to 50 atomic percent of halogen atoms.

14. The photoconductive member according to one of claims 1, or 2 wherein the layer containing amorphous boron material contains a total of 1 to 50 atomic percent of hydrogen and halogen.

* * * * *

UNITED STATES PATENT AND TRADEMARK OFFICE
CERTIFICATE OF CORRECTION

PATENT NO. : 4,525,442

DATED : June 25, 1985

INVENTOR(S) : SHIGERU SHIRAI, ET AL.

It is certified that error appears in the above-identified patent and that said Letters Patent is hereby corrected as shown below:

Column 1, line 12, change "ultravoilet" to --ultraviolet--.

Column 1, line 40, insert --discloses-- before "an application".

Column 1, line 60, change "phenomenon" to --phenomena--.

Column 3, line 14, insert --a-- between "to" and "further".

Column 3, line 44, change "photoconductives" to --photoconductive--.

Column 5, line 48, change "at" to --to--.

Column 6, line 36, change "is" to --are--.

Column 6, line 64, delete comma (",").

Column 7, lines 9, 10, insert --be-- between "generally" and "1".

Column 7, line 52, delete "0" [occurring after "4"].

Column 7, line 54, change "NA" to --Na--.

Column 10, line 18, change "less" to --least--.

Column 12, line 22, change "in" to --is--.

Column 12, line 26, change "substance" to --substances--.

Column 13, line 33, insert comma (--,--) between "($HN_3$)" and "ammonium".

UNITED STATES PATENT AND TRADEMARK OFFICE
CERTIFICATE OF CORRECTION

PATENT NO. : 4,525,442
DATED : June 25, 1985
INVENTOR(S) : SHIGERU SHIRAI, ET AL.

It is certified that error appears in the above-identified patent and that said Letters Patent is hereby corrected as shown below:

Column 13, line 42, delete first occurrence of "the".

Column 16, lines 10, 11, insert --be-- between "generally" and "in".

Column 18, line 5, change "an" to --a--.

Column 18, line 58, delete "on".

Column 18, line 66, insert --be-- between "cannot" and "effectively".

Column 21, line 23, change "were" to --was--.

Column 21, lines 34, 35, delete "and then".

Column 21, line 64, change "graduation" to --gradation--.

Column 22, Table 1, lines 12-14, insert --0-- under "100A°", "1000A°", and before the word "Excellent".

Column 22, line 20, change "an" to --a--.

Column 24, lines 15, 16, delete "and then".

Column 24, Table 2, lines 65, 66, insert --0-- under "100A°", "1000A°", and before the word "Excellent".

Column 27, lines 13, 14, delete "and then".

Column 27, Table 3, lines 65, 66, insert --0-- under "120A°", "1000A°", and before the word "Excellent".

UNITED STATES PATENT AND TRADEMARK OFFICE
CERTIFICATE OF CORRECTION

PATENT NO. : 4,525,442

DATED : June 25, 1985

INVENTOR(S) : SHIGERU SHIRAI, ET AL.

It is certified that error appears in the above-identified patent and that said Letters Patent is hereby corrected as shown below:

Column 28, line 5, insert --was prepared according to the-- between "FIG. 3" and "following".

Column 29, line 2, delete "508" between "frequency" and "power".

Column 29, line 52, change "degass" to --degas--.

Column 29, lines 65, 66, delete "and then".

Column 30, line 22, change "high" to --higher--.

Column 30, line 38, change "Table 1"; to --Table 4--.

Column 30, Table 4, lines 40, 41, insert --0-- under "100A°", "1000A°", and before the word "Excellent".

Column 32, line 27, change "degass" to --degas--.

Column 32, line 30, change "1Kg/cm$_2$" to --1Kg/cm$^2$--.

Column 32, lines 41, 42, delete "and then".

Column 33, line 13, change "Table 2" to --Table 5--.

Column 33, Table 5, lines 15, 16, insert --0-- under "100A°", "1000A°", and before the word "Excellent".

Column 34, line 45, delete "b".

Column 35, line 3, change "procesures" to --procedures--.

UNITED STATES PATENT AND TRADEMARK OFFICE
CERTIFICATE OF CORRECTION

PATENT NO. : 4,525,442
DATED : June 25, 1985
INVENTOR(S) : SHIGERU SHIRAI, ET AL.

It is certified that error appears in the above-identified patent and that said Letters Patent is hereby corrected as shown below:

Column 35, line 10, change "degass" to --degas--.

Column 35, lines 22, 23, delete "and then".

Column 35, line 59, change "Table 3" to --Table 6--.

Column 35, Table 6, lines 61, 62, insert --0-- under "120A°", "1000A°", and beforethe word "Excellent".

Claim 2, line 10, change "$(H_{62}X_{1-\beta})$" to --$(H_{\beta}X_{1-\beta})$--.

Claim 2, line 14, change "$(H,X)_{1-67}$"; to --$(H,X)_{1-\delta}$--.

Signed and Sealed this

Fourth Day of November, 1986

[SEAL]

Attest:

DONALD J. QUIGG

Attesting Officer

Commissioner of Patents and Trademarks